US012543527B2

(12) United States Patent
Inoue et al.

(10) Patent No.: US 12,543,527 B2
(45) Date of Patent: Feb. 3, 2026

(54) WAFER PLACEMENT TABLE, AND MEMBER FOR SEMICONDUCTOR MANUFACTURING APPARATUS, USING THE SAME

(71) Applicant: NGK Insulators, Ltd., Nagoya (JP)

(72) Inventors: Seiya Inoue, Handa (JP); Tatsuya Kuno, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 683 days.

(21) Appl. No.: 17/929,043

(22) Filed: Sep. 1, 2022

(65) Prior Publication Data

US 2023/0238258 A1 Jul. 27, 2023

(30) Foreign Application Priority Data

Jan. 27, 2022 (JP) .................................. 2022-011102
Jul. 5, 2022 (JP) .................................. 2022-108450

(51) Int. Cl.
*H01L 21/67* (2006.01)
*H01J 37/32* (2006.01)
*H01L 21/687* (2006.01)

(52) U.S. Cl.
CPC .............. *H01L 21/67109* (2013.01); *H01J 37/32532* (2013.01); *H01J 37/32642* (2013.01); *H01J 37/32724* (2013.01); *H01L 21/68785* (2013.01)

(58) Field of Classification Search
CPC ........... H01L 21/68785; H01L 21/6831; H01L 21/6833; H01J 37/32715; H01J 37/32724
See application file for complete search history.

(56) References Cited

U.S. PATENT DOCUMENTS

| 2003/0169553 | A1* | 9/2003 | Brown | H02N 13/00 |
| | | | | 361/234 |
| 2006/0279899 | A1* | 12/2006 | Aihara | H01L 21/6831 |
| | | | | 361/234 |
| 2007/0274020 | A1* | 11/2007 | Park | H01L 21/67109 |
| | | | | 361/234 |
| 2008/0178608 | A1 | 7/2008 | Tandou et al. | |
| 2012/0285658 | A1* | 11/2012 | Roy | H01L 21/68785 |
| | | | | 165/47 |
| 2015/0036261 | A1 | 2/2015 | Jindo et al. | |

(Continued)

FOREIGN PATENT DOCUMENTS

CN 108780774 A * 11/2018 ............... B23Q 3/15
JP H11-233605 A 8/1999

(Continued)

OTHER PUBLICATIONS

Machine Translation included with Printed Publication CN-108780774-A (Year: 2018).*

(Continued)

*Primary Examiner* — Tyrone V Hall, Jr.
(74) *Attorney, Agent, or Firm* — BURR PATENT LAW, PLLC

(57) ABSTRACT

A wafer placement table includes a ceramic base having a wafer placement surface on its top surface and incorporating an electrode, a cooling base provided on a bottom surface side of the ceramic base, and a refrigerant flow channel groove provided in the cooling base so as to open at a bottom surface of the cooling base.

14 Claims, 15 Drawing Sheets

(56) References Cited

U.S. PATENT DOCUMENTS

| | | | |
|---|---|---|---|
| 2015/0077895 A1 | 3/2015 | Jindo et al. | |
| 2015/0122464 A1 | 5/2015 | Ito et al. | |
| 2019/0013231 A1 | 1/2019 | Yamaguchi et al. | |
| 2019/0035609 A1 | 1/2019 | Tobe | |
| 2019/0341289 A1* | 11/2019 | Parkhe | H01L 21/68785 |
| 2020/0286755 A1 | 9/2020 | Ito | |
| 2020/0312684 A1 | 10/2020 | Mine et al. | |
| 2020/0395236 A1 | 12/2020 | Iijima et al. | |
| 2021/0028029 A1 | 1/2021 | Mo | |

FOREIGN PATENT DOCUMENTS

| | | | |
|---|---|---|---|
| JP | 2001-257253 A | 9/2001 | |
| JP | 2006-156691 A | 6/2006 | |
| JP | 2008-186856 A | 8/2008 | |
| JP | 2014-082476 A | 5/2014 | |
| JP | 5666748 B1 | 2/2015 | |
| JP | 5666749 B1 | 2/2015 | |
| JP | 2017-126641 A | 7/2017 | |
| JP | 2017-201669 A | 11/2017 | |
| JP | 2019-212775 A | 12/2019 | |
| JP | 2020-145238 A | 9/2020 | |
| JP | 2020-161597 A | 10/2020 | |
| KR | 10-2005-0021596 A | 3/2005 | |
| KR | 10-2014-0137016 A | 12/2014 | |
| KR | 10-2017-0087844 A | 7/2017 | |
| KR | 101927937 B1 * | 12/2018 | H01L 21/6831 |
| KR | 10-2019-0011686 A | 2/2019 | |
| KR | 10-2019-0138592 A | 12/2019 | |
| KR | 10-2020-0106456 A | 9/2020 | |
| TW | 201504192 A | 2/2015 | |
| TW | 202105596 A | 2/2021 | |
| TW | 202119526 A | 5/2021 | |

OTHER PUBLICATIONS

Machine Translation included with Printed Publication KR-101927937-B1 (Year: 2018).*

Japanese Office Action (with English translation) dated Feb. 25, 2025 (Application No. 2022-108450).

Korean Office Action (with English translation) dated Feb. 22, 2024 (Application No. 10-2022-0117057).

Chinese Office Action (Application No. 202211088070.8) dated Nov. 30, 2024 (7 pages).

Taiwanese Office Action (Application No. 111135018) dated Jun. 19, 2023 (5 pages).

Chinese Office Action (with English translation) dated Jul. 23, 2025 (Application No. 202211088070.8).

* cited by examiner

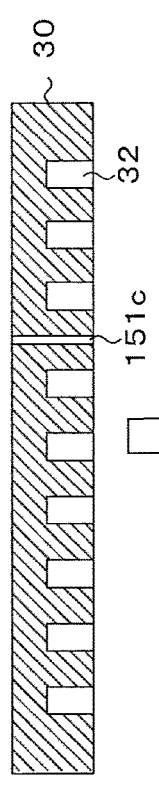
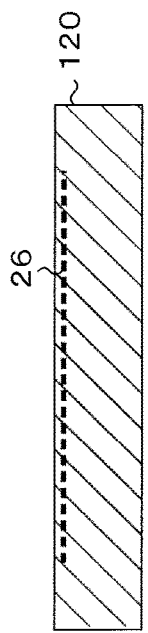
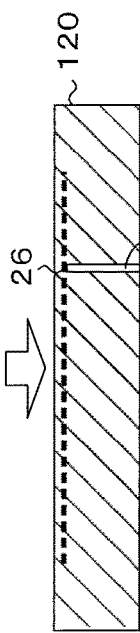
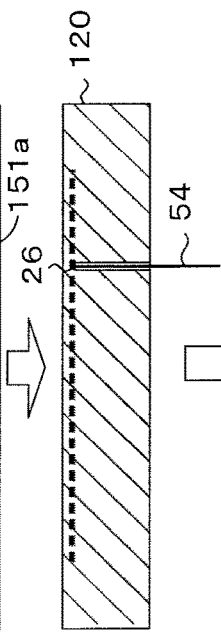
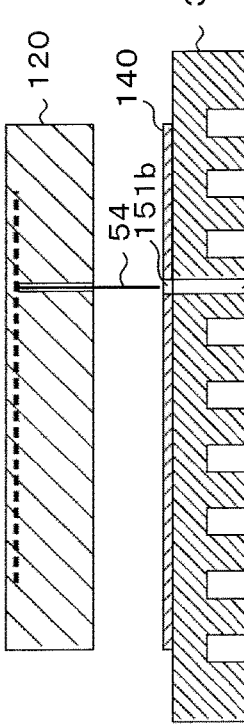
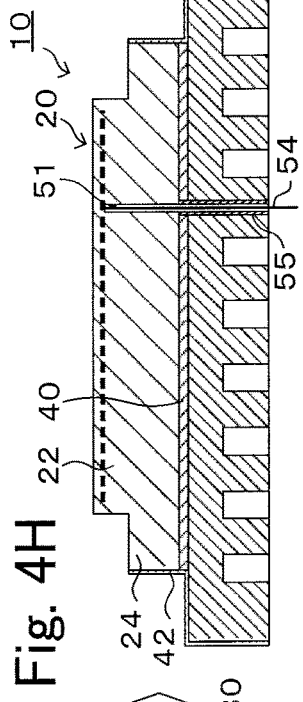
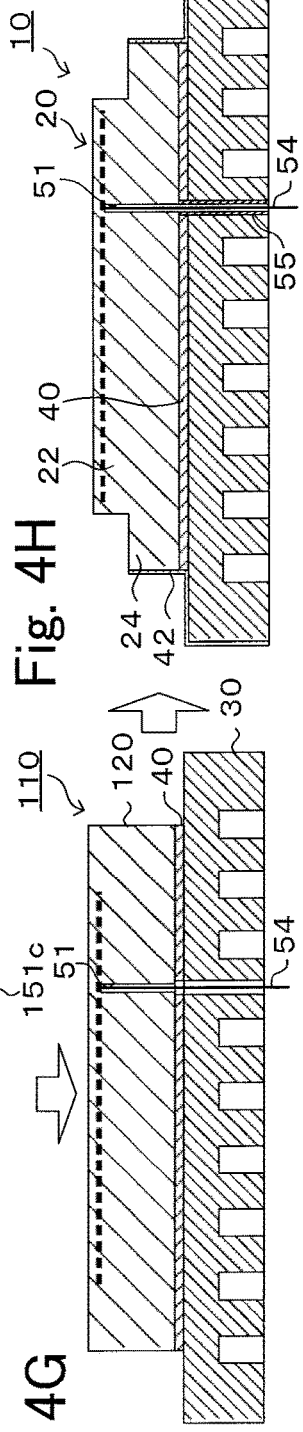
Fig. 4A  Fig. 4B  Fig. 4C  Fig. 4D  Fig. 4E  Fig. 4F  Fig. 4G  Fig. 4H

WAFER PLACEMENT TABLE, AND MEMBER FOR SEMICONDUCTOR MANUFACTURING APPARATUS, USING THE SAME

BACKGROUND OF THE INVENTION

1. Field of the Invention

The present invention relates to a wafer placement table, and a member for semiconductor manufacturing apparatus, using the same.

2. Description of the Related Art

Hitherto, there is known a wafer placement table in which a ceramic base having an embedded electrostatic electrode and a cooling base having a refrigerant flow channel inside are bonded to each other by a metal bonding layer (see, for example, Patent Literatures 1 and 2). The cooling base is made, for example, as follows. Initially, first to third substrates made of a metal matrix composite material are prepared. The first and third substrates each are a disk. The second substrate is a disk with a punched part by punching the disk into the same shape as a refrigerant flow channel from one side to the other side. Subsequently, the second substrate is sandwiched by the first substrate and the third substrate into a laminated body. At this time, a metal bonding material is placed between the second substrate and the first substrate and between the second substrate and the third substrate. Then, by subjecting the laminated body to thermal compression bonding, a cooling base in which the punched part is a refrigerant flow channel, a metal bonding layer is formed between the first substrate and the second substrate, and a metal bonding layer is formed between the second substrate and the third substrate is obtained.

CITATION LIST

Patent Literature

PTL 1: Japanese Patent No. 5666748 B
PTL 2: Japanese Patent No. 5666749 B

SUMMARY OF THE INVENTION

However, in the above-described wafer placement table, many kinds of materials used for a cooling base are needed, so there is an inconvenience that a material cost increases and, as a result, the cost of the wafer placement table increases.

The present invention is made to solve such an inconvenience, and it is a main object to hold down the cost of a wafer placement table.

[1] A wafer placement table of the present invention includes a ceramic base having a wafer placement surface on its top surface and incorporating an electrode, a cooling base provided on a bottom surface side of the ceramic base, and a refrigerant flow channel groove provided in the cooling base so as to open at a bottom surface of the cooling base.

In the wafer placement table, the bottom surface of the cooling base is attached to a mounting plate different from the wafer placement table via a seal member surrounding the refrigerant flow channel groove during usage. In this case, the opening of the refrigerant flow channel groove is closed by the seal member and the mounting plate to form a refrigerant flow channel. The cooling base has the refrigerant flow channel groove, and the refrigerant flow channel groove opens at the bottom surface of the cooling base. Therefore, as compared to an existing cooling base incorporating a refrigerant flow channel, types of materials used for a cooling base are reduced. Therefore, it is possible to hold down the cost of the wafer placement table.

In the specification, up and down, right and left, front and rear, and the like can be used for describing the present invention; however, up and down, right and left, and front and rear are only relative positional relationships. Therefore, when the orientation of the wafer placement table is changed, up and down can be right and left or right and left can be up and down. The technical scope of the present invention also encompasses such a case.

[2] In the above-described wafer placement table (the wafer placement table described in [1]), the cooling base may be made of a composite material of metal and ceramics. With such a composite material, it is possible to reduce a difference in coefficient of linear thermal expansion (CTE) between the composite material and a ceramic material that is a component of a ceramic base. Therefore, it is possible to prevent breakage of bonding between the ceramic base and the cooling base due to thermal stress. In addition, such a composite material is relatively expensive, the significance of reducing a cost is high.

[3] In the above-described wafer placement table (the wafer placement table described in [1] or [2]), the cooling base may be bonded to a bottom surface of the ceramic base via a metal bonding layer. With this configuration, in comparison with the case where the cooling base is bonded to the bottom surface of the ceramic base via a resin (organic) bonding layer, it is possible to efficiently dissipate heat of the wafer placement surface to the cooling base.

[4] In the above-described wafer placement table (the wafer placement table described in any one of [1] to [3]), in an area that overlaps the wafer placement surface in plan view of the refrigerant flow channel groove, a distance from a ceiling surface of the refrigerant flow channel groove to the wafer placement surface at a most downstream part of the refrigerant flow channel groove may be shorter than the distance at a most upstream part of the refrigerant flow channel groove. During usage of the wafer placement table, the opening of the refrigerant flow channel groove is closed by a member different from the wafer placement table to form a refrigerant flow channel, and then refrigerant is flowed through the refrigerant flow channel. Refrigerant flows from the most upstream part of the refrigerant flow channel toward the most downstream part while dissipating heat from a high-temperature wafer, so the temperature of refrigerant flowing through the refrigerant flow channel at the most downstream part is higher than the temperature of refrigerant flowing through the refrigerant flow channel at the most upstream part. On the other hand, since the distance from the ceiling surface of the refrigerant flow channel to the wafer placement surface at the most downstream part of the refrigerant flow channel is shorter than the distance at the most upstream part of the refrigerant flow channel, thermal resistance from the ceiling surface of the refrigerant flow channel to the wafer placement surface at the most downstream part is lower than thermal resistance from the ceiling surface of the refrigerant flow channel to the wafer placement surface at the most upstream part. Therefore, generally, it is possible to reduce the temperature difference between a location facing the most upstream part of the refrigerant flow channel and a location facing the most downstream part of the refrigerant flow channel in the wafer placement surface. Therefore, the soaking performance of a wafer increases.

[5] In the above-described wafer placement table (the wafer placement table described in any one of [1] to [4]), in an area that overlaps the wafer placement surface in plan view of the refrigerant flow channel groove, a cross-sectional area of the refrigerant flow channel groove at a most downstream part of the refrigerant flow channel groove may be less than a cross-sectional area of the refrigerant flow channel groove at a most upstream part of the refrigerant flow channel groove. During usage of the wafer placement table, the opening of the refrigerant flow channel groove is closed by a member different from the wafer placement table to form a refrigerant flow channel, and then refrigerant is flowed through the refrigerant flow channel. Refrigerant flows from the most upstream part of the refrigerant flow channel toward the most downstream part while dissipating heat from a high-temperature wafer, so the temperature of refrigerant flowing through the refrigerant flow channel at the most downstream part is higher than the temperature of refrigerant flowing through the refrigerant flow channel at the most upstream part. On the other hand, since the cross-sectional area of the refrigerant flow channel at the most downstream part of the refrigerant flow channel is less than the cross-sectional area of the refrigerant flow channel at the most upstream part of the refrigerant flow channel, a pressure loss is larger at the most downstream part than at the most upstream part, so heat exchange between refrigerant and the wafer is more promoted at the most downstream part than at the most upstream part. Therefore, generally, it is possible to reduce the temperature difference between a location facing the most upstream part of the refrigerant flow channel and a location facing the most downstream part of the refrigerant flow channel in the wafer placement surface. Therefore, the soaking performance of a wafer increases.

[6] In the above-described wafer placement table (the wafer placement table described in any one of [1] to [5]), the cooling base may have a hole extending through the cooling base in an up and down direction, the cooling base may include a heat exchange promoting portion in an area around the hole, and, when the refrigerant flow channel groove is used as a refrigerant flow channel, the heat exchange promoting portion may promote heat exchange between refrigerant flowing through the refrigerant flow channel and a wafer placed on the wafer placement surface. Generally, an area around just above such a hole in a wafer tends to be a hot spot; however, the heat exchange promoting portion is provided in an area around such a hole here, so heat dissipation of the area around the hole is promoted. Therefore, it is possible to reduce occurrence of a hot spot in a wafer.

[7] In the above-described wafer placement table (the wafer placement table described in any one of [1] to [6]), in the wafer placement table, the bottom surface of the cooling base may be attached to a mounting plate different from the wafer placement table via a seal member surrounding the refrigerant flow channel groove during usage.

[8] In the above-described wafer placement table (the wafer placement table described in [7]), the cooling base may have a central part fastening member that fastens a central part of the cooling base to the mounting plate. The "central part of the cooling base" may be the center of the cooling base or may be the circumference of a circle smaller in diameter than the cooling base.

[9] In the above-described wafer placement table (the wafer placement table described in any one of [1] to [8]), in a shape of a vertical cross-section of the refrigerant flow channel groove (a shape that appears on a cross section of the wafer placement table, taken in a direction perpendicular to the wafer placement surface), the width of a ceiling part of the refrigerant flow channel groove may be wider than the width of an opening part of the refrigerant flow channel groove, and a space between any adjacent opening parts of the refrigerant flow channel groove may be wider than a space between any adjacent ceiling parts of the refrigerant flow channel groove. With this configuration, since the space between any adjacent opening parts of the refrigerant flow channel groove is wide, it is possible to reduce mixing of refrigerant between the opening parts. In addition, since the space between any adjacent ceiling parts of the refrigerant flow channel groove is narrow, an area that is cooled by refrigerant widens, so cooling efficiency increases. Furthermore, since the total area of the opening part of the refrigerant flow channel groove is narrower than the total area of the ceiling part, a force due to the pressure of refrigerant applied between the cooling base and the chamber-side mounting plate is reduced.

[10] In the above-described wafer placement table (the wafer placement table described in [9]), the opening parts of the refrigerant flow channel groove does not need to be hermetically sealed by a seal ring. Even when the opening part of the refrigerant flow channel groove is not hermetically sealed by a seal ring but the space between any adjacent opening parts of the refrigerant flow channel groove is relatively wide, it is possible to reduce mixing of refrigerant between the opening parts.

[11] In the above-described wafer placement table (the wafer placement table described in [9]), the opening parts of the refrigerant flow channel groove may be hermetically sealed by a seal ring. With this configuration, the seal ring reduces mixing of refrigerant between any adjacent opening parts of the refrigerant flow channel groove, so it is possible to relatively narrow the space between any adjacent opening parts of the refrigerant flow channel groove, and, as a result, it is possible to densely provide the refrigerant flow channel groove. Accordingly, since the space between any adjacent ceiling parts of the refrigerant flow channel groove is narrower, an area that is cooled by refrigerant further widens, so cooling efficiency further increases.

[12] A member for semiconductor manufacturing apparatus of the present invention includes the wafer placement table according to any one of [1] to [11], a mounting plate on which the bottom surface of the cooling base is mounted via a seal member surrounding the refrigerant flow channel groove, and an outer peripheral part fastening member that fastens an outer peripheral part of the wafer placement table to the mounting plate. In the member for semiconductor manufacturing apparatus, the bottom surface of the cooling base is attached to the mounting plate via the seal member surrounding the refrigerant flow channel groove, with the result that the opening of the refrigerant flow channel groove is closed to form a refrigerant flow channel. In such a member for semiconductor manufacturing apparatus, when a central part fastening member that fastens the central part of the cooling base to the mounting plate is provided, not only the outer peripheral part of the wafer placement table but also the central part of the wafer placement table is fixed to the mounting plate, so it is possible to prevent a warpage of the wafer placement table resulting from usage. As a result, it is possible to maintain sealing performance with the seal member over a long term. In addition, since the seal member is on the lower side of the cooling base (the refrigerant flow channel groove is provided on the upper side of the seal member), even when the ceramic base becomes a high temperature, it is less likely to receive the influence of the high-temperature ceramic base. Therefore, it is not necessary to use a high heat-resistant material as the seal member.

[13] In the above-described member for semiconductor manufacturing apparatus (the member for semiconductor manufacturing apparatus, described in [12]), the absolute value of a difference in CTE from 40° C. to 400° C. between the cooling base and the mounting plate may be greater than or equal to $1.5 \times 10^{-6}$/K. Since the bottom surface of the cooling base and the top surface of the mounting plate are assembled via the seal member, the influence due to a difference in CTE between the cooling base and the mounting plate is absorbed by the seal member. Therefore, it is possible to prevent a crack even when the absolute value of a difference in CTE from 40° C. to 400° C. between the mounting plate and the cooling base is greater than or equal to $1.5 \times 10^{-6}$/K.

BRIEF DESCRIPTION OF THE DRAWINGS

FIGS. 4A to 4H are manufacturing process charts of the wafer placement table 10.

DETAILED DESCRIPTION OF THE INVENTION

Figure 1:
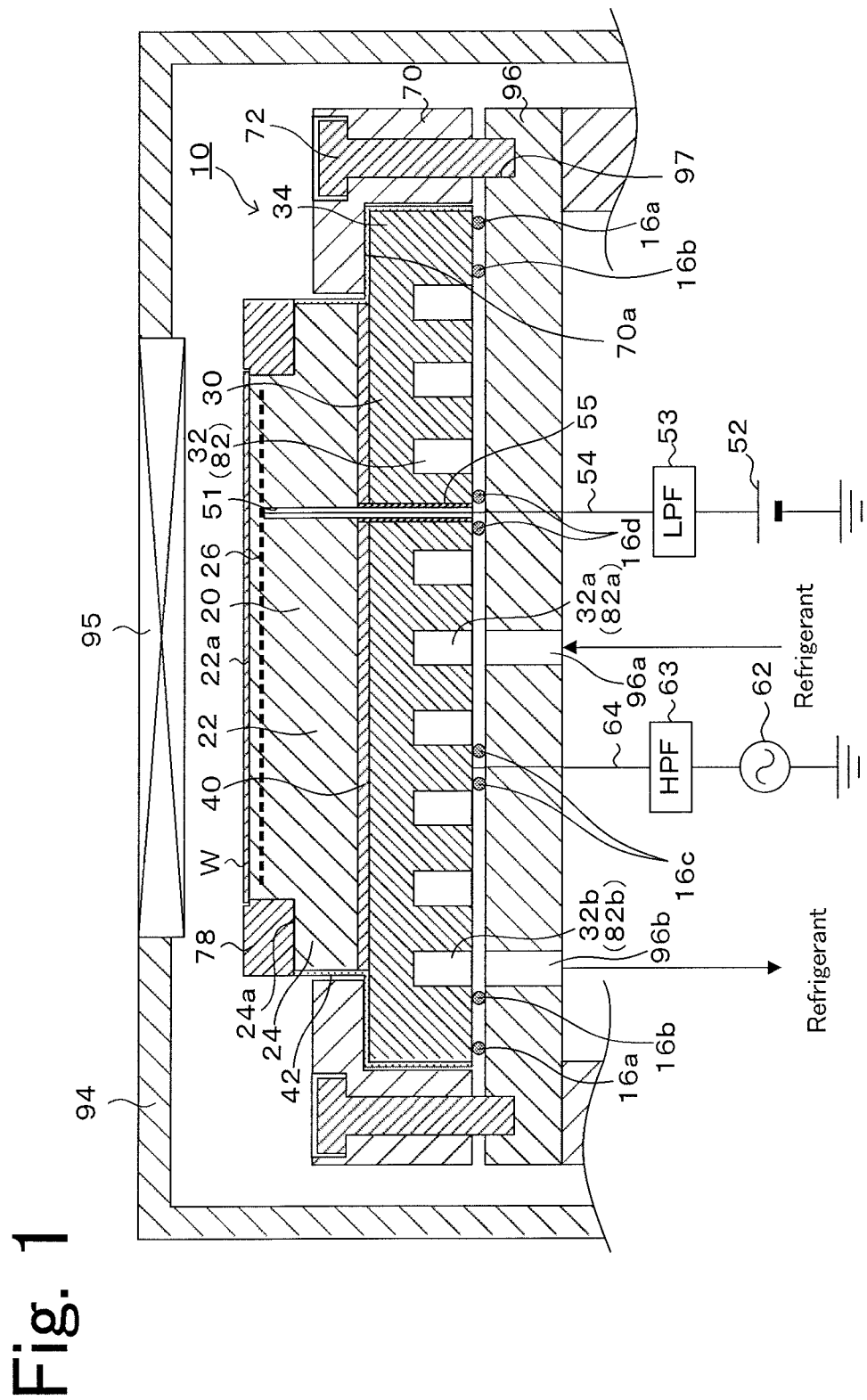
FIG. 1 is a vertical cross-sectional view of a wafer placement table 10 placed in a chamber 94.
Figure 2:
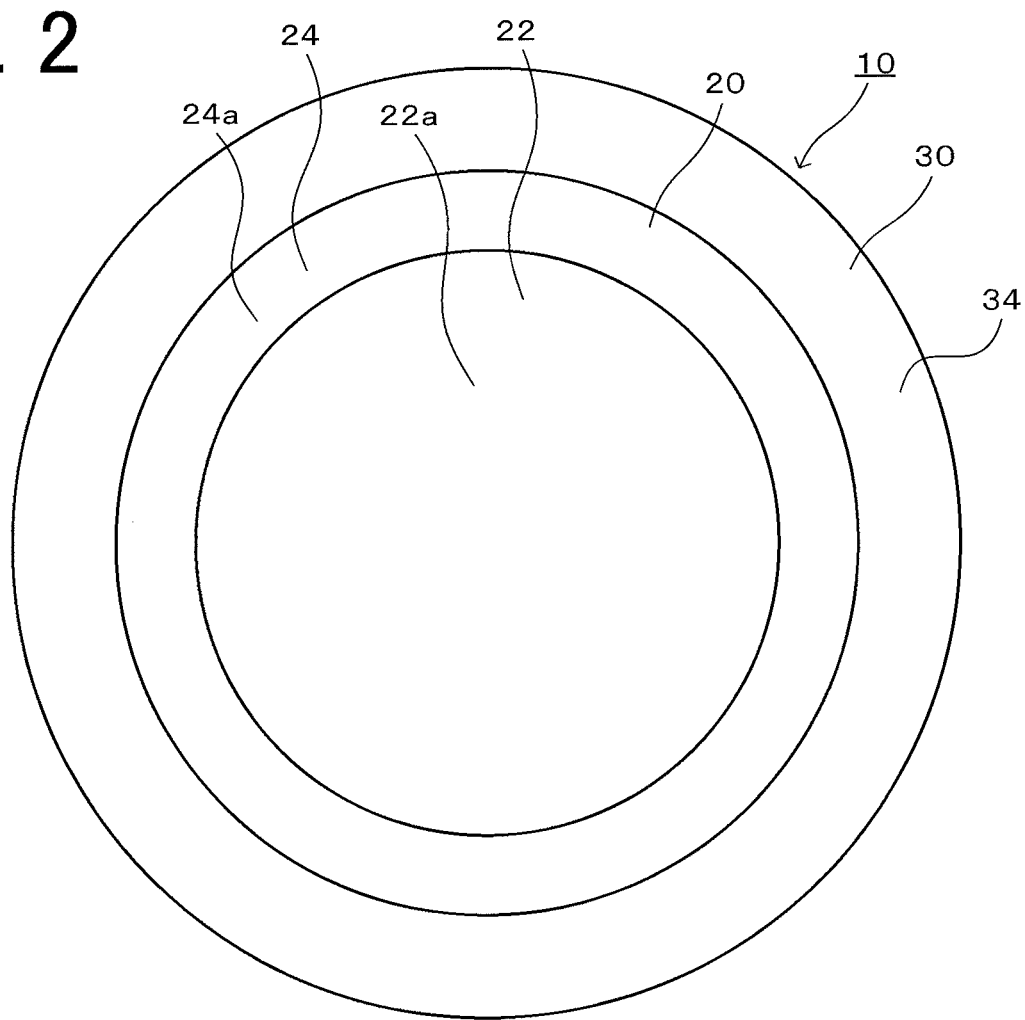
FIG. 2 is a plan view of the wafer placement table 10.
Figure 3:
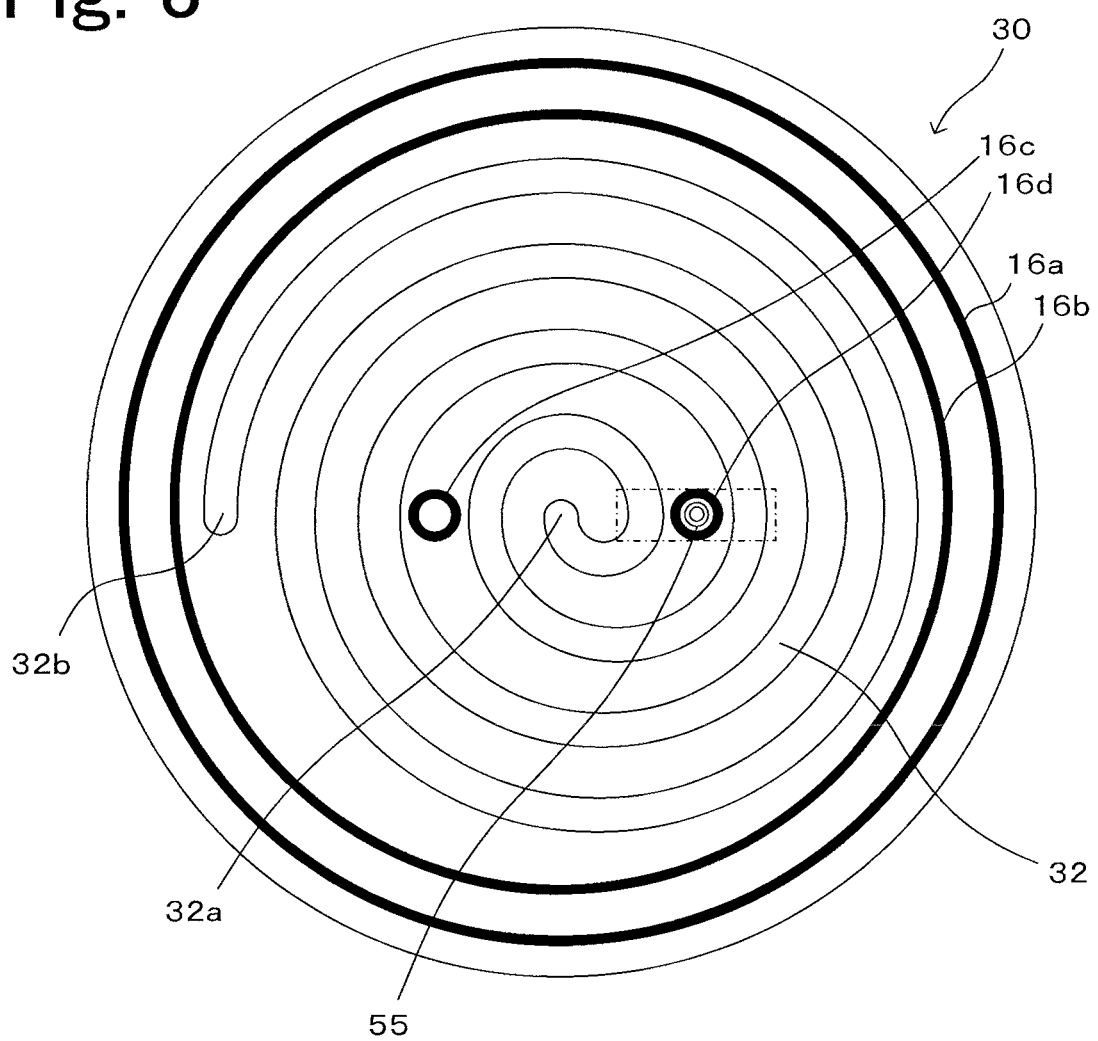
FIG. 3 is a bottom view of a cooling base 30 that includes seal members 16a to 16d.

A preferred embodiment of the present invention will be described below with reference to the drawings. FIG. 1 is a vertical cross-sectional view of a wafer placement table 10 (a sectional view taken along a plane including the central axis of the wafer placement table 10) placed in a chamber 94, FIG. 2 is a plan view of the wafer placement table 10, and FIG. 3 is a bottom view of a cooling base 30 on which seal members 16a to 16d are disposed.

The wafer placement table 10 is used to perform CVD, etching, or the like on a wafer W by using plasma, and is fixed to a mounting plate 96 provided inside a semiconductor process chamber 94. The wafer placement table 10 includes a ceramic base 20, a cooling base 30, and the metal bonding layer 40.

The ceramic base 20 includes an outer peripheral part 24 having an annular focus ring placement surface 24a, on the outer peripheral side of a central part 22 having a circular wafer placement surface 22a. Hereinafter, a focus ring may be abbreviated as "FR". A wafer W is placed on the wafer placement surface 22a, and a focus ring 78 is placed on the FR placement surface 24a. The ceramic base 20 is made of a ceramic material, typically, alumina, aluminum nitride, or the like. The FR placement surface 24a is lower in level than the wafer placement surface 22a.

The central part 22 of the ceramic base 20 incorporates a wafer attraction electrode 26 on the side close to the wafer placement surface 22a. The wafer attraction electrode 26 is made of a material that contains, for example, W, Mo, WC, MoC, or the like. The wafer attraction electrode 26 is a disk-shaped or mesh-shaped single-pole electrostatic attraction electrode. A layer of the ceramic base 20 on the upper side of the wafer attraction electrode 26 functions as a dielectric layer. A wafer attraction direct current power supply 52 is connected to the wafer attraction electrode 26 via a power supply terminal 54. The power supply terminal 54 is inserted through a terminal hole 51 provided between the bottom surface of the wafer attraction electrode 26 and the bottom surface of the cooling base 30 in the wafer placement table 10. The power supply terminal 54 is provided so as to pass through an electrically insulating tube 55 disposed in a through-hole extending through the cooling base 30 and the metal bonding layer 40 in the up and down direction in the terminal hole 51 and reach the wafer attraction electrode 26 from the bottom surface of the ceramic base 20. A low pass filter (LPF) 53 is provided between the wafer attraction direct current power supply 52 and the wafer attraction electrode 26.

The cooling base 30 is a disk member. The material of the cooling base 30 is preferably a composite material of metal and ceramics, or the like. Examples of the composite material include a metal matrix composite material (metal matrix composite or MMC) and a ceramic matrix composite material (ceramic matrix composite or CMC). Specific examples of such composite materials include a material including Si, SiC, and Ti, a material obtained by impregnating an SiC porous body with Al and/or Si, and a composite material of $Al_2O_3$ and TiC. The material including Si, SiC, and Ti is referred to as SiSiCTi, the material that impregnates an SiC porous body with Al is referred to as AlSiC, and the material that impregnates an SiC porous body with Si is referred to as SiSiC. When the ceramic base 20 is an alumina base, the composite material used for the cooling base 30 is preferably AlSiC, SiSiCTi, or the like of which the CTE is close to the CTE of alumina. The cooling base 30 has a refrigerant flow channel groove 32. The refrigerant flow channel groove 32 is formed spirally in a one-stroke pattern from an inlet 32a provided around the center to an outlet 32b provided on the outer peripheral side, and is provided in the cooling base 30 so as to open at the bottom surface of the cooling base 30. The opening of the refrigerant flow channel groove 32 is closed by the top surface of the mounting plate 96 in the chamber 94 to form a refrigerant flow channel 82. Therefore, the refrigerant flow channel groove 32 defines the side wall and the ceiling surface of the refrigerant flow channel 82. Refrigerant flowing through the refrigerant flow channel 82 is preferably liquid and preferably has electrical insulating properties. Examples of the liquid having electrical insulating properties include fluorinert fluid, or the like. The thickness of the upper side of the cooling base 30 above the refrigerant flow channel groove 32 is preferably less than or equal to 5 mm and more preferably less than or equal to 3 mm. Upper-side edge portions (edge portions at which the side wall and the ceiling surface intersect) of the refrigerant flow channel groove 32 are preferably rounded surfaces, and the radius of curvature of each rounded surface is preferably, for example, 0.5 mm to 2 mm. The cooling base 30 is connected to an RF power supply 62 via a power supply terminal 64. A high pass filter (HPF) 63 is disposed between the cooling base 30 and the RF power supply 62. The cooling base 30 has a flange 34 used to clamp the outer peripheral part of the wafer placement table 10 to the mounting plate 96. The mounting plate 96 has a single-layer structure and is made of an electrically insulating material, such as alumina.

The metal bonding layer 40 bonds the bottom surface of the ceramic base 20 with the top surface of the cooling base 30. The metal bonding layer 40 may be, for example, a layer made of solder or a brazing metal material. The metal bonding layer 40 is formed by, for example, TCB (thermal compression bonding). TCB is a known method of sandwiching a metal bonding material between two members to be bonded and bonding the two members in a state heated to a temperature lower than or equal to a solidus temperature of the metal bonding material.

The side surface of an outer peripheral part 24 of the ceramic base 20, the outer periphery of the metal bonding layer 40, the top surface and the side surface of the flange 34 of the cooling base 30 are coated with an electrically insulating film 42. Examples of the electrically insulating film 42 include a sprayed film made of alumina, yttria, or the like.

The thus configured wafer placement table 10 is attached to the mounting plate 96 inside the chamber 94 by using a clamp member 70. The clamp member 70 is an annular member with a substantially inverted L-shaped cross section and has an inner peripheral step surface 70a. The wafer placement table 10 and the mounting plate 96 are united by the clamp member 70. In a state where the inner peripheral step surface 70a of the clamp member 70 is placed on the flange 34 of the cooling base 30 of the wafer placement table 10, bolts 72 are inserted from the top surface of the clamp member 70 and screwed to threaded holes 97 provided on the top surface of the mounting plate 96. The bolts 72 are mounted at multiple locations (for example, eight locations or 12 locations) provided at equal intervals along the circumferential direction of the clamp member 70. The clamp member 70 and the bolts 72 may be made of an electrically insulating material or may be made of an electrically conductive material (metal or the like). The seal members 16a to 16d are disposed at predetermined locations between the bottom surface of the cooling base 30 and the top surface of the mounting plate 96. The seal members 16a to 16d are squished in the up and down direction by screwing the bolts 72 into the threaded holes 97 to exercise sealing performance. The clamp member 70, the bolts 72, and the threaded holes 97 of the mounting plate 96 correspond to an outer peripheral part fastening member.

The seal member 16a is an O-ring with a diameter slightly less than the diameter of the cooling base 30. The seal member 16b is an O-ring with a diameter slightly less than the diameter of the seal member 16a, and surrounds the refrigerant flow channel groove 32 during usage of the wafer placement table 10. The seal member 16c is disposed so as to surround the power supply terminal 64 in an area on the bottom surface of the cooling base 30 where the refrigerant flow channel groove 32 is not provided. The seal member 16d is disposed so as to surround the power supply terminal 54 in an area on the bottom surface of the cooling base 30 where the refrigerant flow channel groove 32 is not provided. An O-ring, a gasket, or the like may be used as each of the seal members 16a to 16d. The seal members 16a to 16d may be made of an electrically insulating material (for example, made of resin, such as PTFE) or may be made of an electrically conductive material (for example, made of metal).

A refrigerant supply port 96a is provided in the mounting plate 96 at a location facing the inlet 32a of the refrigerant flow channel groove 32 so as to extend through in the up and down direction, and a refrigerant discharge port 96b is provided in the mounting plate 96 at a location facing the outlet 32b so as to extend through in the up and down direction. A refrigerant supply/discharge device (not shown) is connected to the refrigerant supply port 96a and the refrigerant discharge port 96b. The refrigerant flow channel 82 is formed when the opening of the refrigerant flow channel groove 32 is closed by the mounting plate 96. In the present embodiment, a slight gap surrounded by the bottom surface of the cooling base 30, the top surface of the mounting plate 96, and the seal member 16b (except the space inside each of the seal members 16c, 16d) also serves as part of the refrigerant flow channel 82. When refrigerant is supplied from the refrigerant supply/discharge device to the refrigerant supply port 96a, the refrigerant passes from an inlet 82a of the refrigerant flow channel 82 (the inlet 32a of the refrigerant flow channel groove 32) through the refrigerant flow channel 82 (the refrigerant flow channel groove 32) to an outlet 82b (the outlet 32b of the refrigerant flow channel groove), and returns from there to the refrigerant supply/discharge device via the refrigerant discharge port 96b. The refrigerant supply/discharge device adjusts the temperature of the returned refrigerant and then supplies the refrigerant to the refrigerant supply port 96a again.

Next, an example of manufacturing of the wafer placement table 10 will be described with reference to FIGS. 4A to 4H. FIGS. 4A to 4H are manufacturing process charts of the wafer placement table 10. Initially, a disk-shaped ceramic sintered body 120 that is the source of the ceramic base 20 is made by firing a ceramic powder mold by hot pressing (FIG. 4A). The ceramic sintered body 120 incorporates the wafer attraction electrode 26. Subsequently, a terminal hole upper part 151a is formed from the bottom surface of the ceramic sintered body 120 to the wafer attraction electrode 26 (FIG. 4B). Then, the power supply terminal 54 is inserted into the terminal hole upper part 151a, and the power supply terminal 54 and the wafer attraction electrode 26 are bonded (FIG. 4C).

In parallel with this, a disk member 130 is made (FIG. 4D). When the ceramic sintered body 120 is made of alumina, the disk member 130 is preferably made of SiSiCTi or AlSiC. This is because the CTE of alumina and the CTE of SiSiCTi or AlSiC are able to be made almost the same.

The disk member made of SiSiCTi can be made by, for example, as follows. Initially, a powder mixture is made by mixing silicon carbide, metal Si and metal Ti. After that, a disk-shaped mold is made by uniaxial pressing of the obtained powder mixture, and the mold is sintered by hot pressing in an inert atmosphere, with the result that the disk member made of SiSiCTi is obtained.

Subsequently, a terminal hole lower part 151c extending through the disk member 130 in the up and down direction is perforated, and the refrigerant flow channel groove 32 is formed on the bottom surface of the disk member 130 by machining, with the result that the cooling base 30 is obtained (FIG. 4E).

Subsequently, a metal bonding material 140 is disposed on the top surface of the cooling base 30 (FIG. 4F). A terminal hole middle part 151b is provided in advance in the metal bonding material 140 at a location facing the terminal hole upper part 151a and the terminal hole lower part 151c. The power supply terminal 54 of the ceramic sintered body 120 is inserted into the terminal hole middle part 151b and the terminal hole lower part 151c, and the ceramic sintered body 120 is placed on the metal bonding material 140 disposed on the top surface of the cooling base 30. Thus, a laminated body in which the cooling base 30, the metal bonding material 140, and the ceramic sintered body 120 are laminated in this order from the bottom is obtained. By pressurizing the laminated body while heating the laminated body (TCB), a bonded body 110 is obtained (FIG. 4G). The bonded body 110 is configured such that the ceramic sintered body 120 is bonded to the top surface of the cooling base 30 via the metal bonding layer 40. The terminal hole 51 is a hole made up of the continuous terminal hole upper part 151a, terminal hole middle part 151b, and terminal hole lower part 151c.

TCB is performed, for example, as follows. The laminated body is pressurized at a temperature lower than or equal to a solidus temperature of the metal bonding material (for example, higher than or equal to a temperature obtained by subtracting 20° C. from the solidus temperature and lower than or equal to the solidus temperature) to perform bonding, after that the temperature is returned to a room temperature. Thus, the metal bonding material becomes the metal bonding layer. An Al—Mg bonding material or an Al—Si—Mg bonding material may be used as the metal bonding material at this time. When, for example, TCB is performed by using an Al—Si—Mg bonding material, the laminated body is pressurized in a state of being heated under vacuum atmosphere. The metal bonding material with a thickness of about 100 μm is preferable.

Subsequently, the ceramic base 20 with the central part 22 and the outer peripheral part 24 is obtained by cutting the outer periphery of the ceramic sintered body 120 to form a step. The electrically insulating tube 55 that allows insertion of the power supply terminal 54 is disposed in the terminal hole 51 from the bottom surface of the ceramic base 20 to the bottom surface of the cooling base 30. The side surface of the outer peripheral part 24 of the ceramic base 20, the periphery of the metal bonding layer 40, and the top surface (exposed surface) and the side surface of the cooling base 30 are subjected to thermal spraying by using ceramic powder to form the electrically insulating film 42 (FIG. 4H). Thus, the wafer placement table 10 is obtained.

Next, an example of the use of the wafer placement table 10 will be described with reference to FIG. 1. The wafer placement table 10 is fixed to the mounting plate 96 in the chamber 94 by the clamp member 70 as described above. A shower head 95 that discharges process gas from a large number of gas injection holes into the chamber 94 is disposed on the ceiling surface of the chamber 94.

A focus ring 78 is placed on the FR placement surface 24a of the wafer placement table 10, and a disk-shaped wafer W is placed on the wafer placement surface 22a. The focus ring 78 has a step along the inner periphery of an upper end part so as not to interfere with the wafer W. In this state, the wafer W is attracted to the wafer placement surface 22a by applying a direct current voltage of the wafer attraction direct current power supply 52 to the wafer attraction electrode 26. Then, the inside of the chamber 94 is set to a predetermined vacuum atmosphere (or decompression atmosphere), and an RF voltage from the RF power supply 62 is applied to the cooling base 30 while process gas is being supplied from the shower head 95. As a result, plasma is generated between the wafer W and the shower head 95. Then, the wafer W is subjected to CVD deposition or etching by using the plasma.

In the embodiment described in detail above, during usage of the wafer placement table 10, the bottom surface of the cooling base 30 is attached to the mounting plate 96 different from the wafer placement table 10 via the seal member 16b surrounding the refrigerant flow channel groove 32. The cooling base 30 has the refrigerant flow channel groove 32, and the refrigerant flow channel groove 32 opens at the bottom surface of the cooling base 30. Therefore, as compared to an existing cooling base incorporating a refrigerant flow channel, types of materials used for the cooling base 30 are reduced since no disk that closes the bottom surface is need. Therefore, it is possible to hold down the cost of the wafer placement table 10.

Since the bottom surface of the cooling base 30 and the top surface of the mounting plate 96 are assembled via the seal members 16a to 16d, such as O-rings, the influence due to a difference in CTE between the cooling base 30 and the mounting plate 96 is absorbed by the seal members 16a to 16d. As a result, it is possible to prevent a crack of the cooling base 30. In addition, it is also possible to prevent a crack even when the absolute value of a difference in CTE from 40° C. to 400° C. between the mounting plate 96 and the cooling base 30 is greater than or equal to $1.5 \times 10^{-6}$/K. Therefore, even when an MMC is used for the cooling base 30 and aluminum is used for the mounting plate 96, a difference in CTE is absorbed.

The cooling base 30 is preferably made of a composite material of metal and ceramics. With such a composite material, it is possible to reduce a difference in CTE between the ceramic material that is a component of the ceramic base 20 and the composite material. Therefore, it is possible to prevent breakage of bonding between the ceramic base 20 and the cooling base 30 due to thermal stress. In addition, such a composite material is relatively expensive, the significance of reducing a cost is high.

Furthermore, the cooling base 30 is bonded to the bottom surface of the ceramic base 20 via the metal bonding layer 40. Therefore, in comparison with the case where the cooling base 30 is bonded to the bottom surface of the ceramic base 20 via a resin (organic) bonding layer, it is possible to efficiently dissipate heat of the wafer placement surface 22a to the cooling base 30.

In addition, since the seal members 16a to 16d are on the lower side of the cooling base 30 (the refrigerant flow channel groove 32 is provided on the upper side of the seal members 16a to 16d), even when the ceramic base 20 becomes a high temperature, it is less likely to receive the influence of the high-temperature ceramic base 20. Therefore, it is not necessary to use a high heat-resistant material as the seal members 16a to 16d.

The present invention is not limited to the above-described embodiment and may be, of course, implemented in various modes within the technical scope of the present invention.

Figure 5:
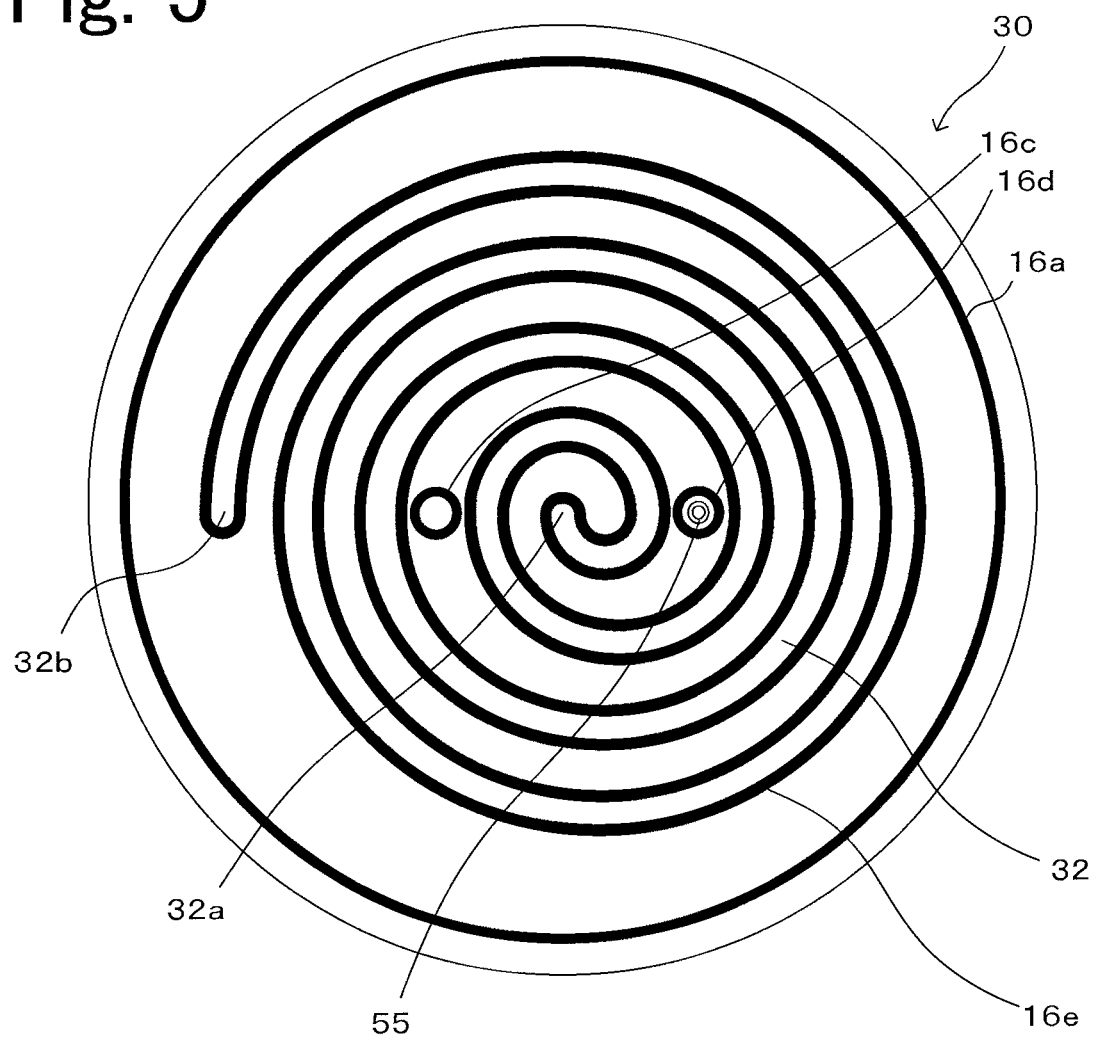
FIG. 5 is a bottom view of the cooling base 30 that includes seal members 16a, 16c to 16e.
Figure 6:
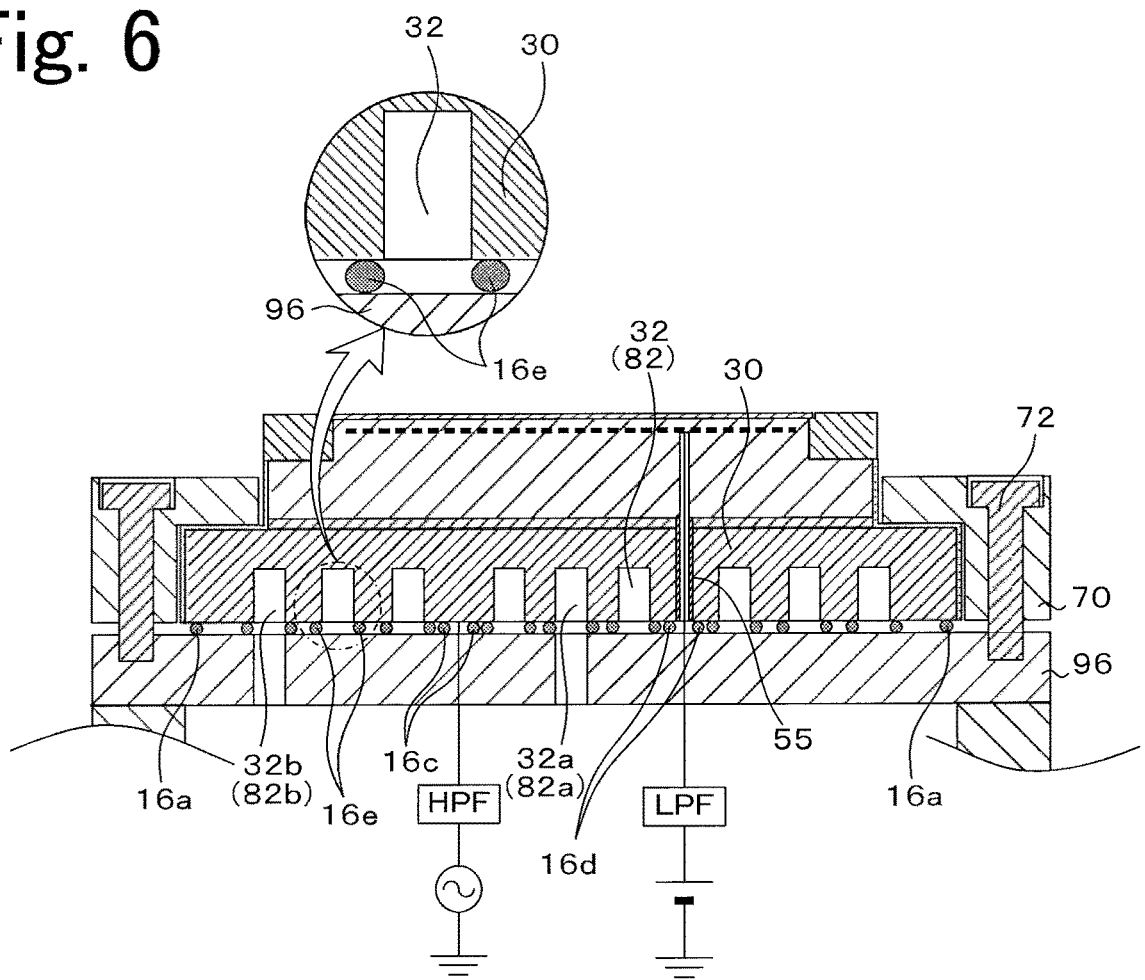
FIG. 6 is a vertical cross-sectional view of a wafer placement table that has the cooling base 30 that includes the seal members 16a, 16c to 16e.
Figure 7:
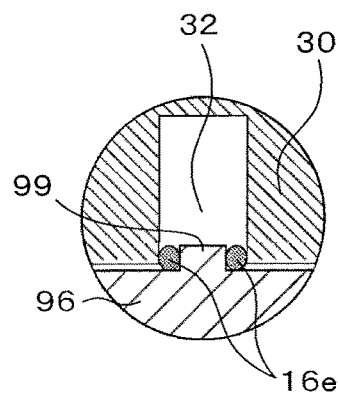
FIG. 7 is a partial vertical cross-sectional view showing another example of the seal member 16e.

In the above-described embodiment, the seal member 16b has a ring shape so as to surround the entire spiral refrigerant flow channel groove 32; however, the configuration is not limited thereto. For example, instead of the seal member 16b, a seal member 16e shown in FIGS. 5 and 6 may be adopted. In FIGS. 5 and 6, like reference signs are assigned to the same components as those of the above-described embodiment. The seal member 16e is formed along the edge of the spiral refrigerant flow channel groove 32 provided on the bottom surface of the cooling base 30 (parallel running seal member). When the seal member 16e is used, flow of refrigerant via a gap between the bottom surface of the cooling base 30 and the top surface of the mounting plate 96 is suppressed. The seal member 16e is squished by the bottom surface of the cooling base 30 and the top surface of the mounting plate 96 to exercise sealing performance. In this case, the reaction force of the seal member 16e is generated in the perpendicular direction, so a fixing force with the bolts 72 needs to be increased. On the other hand, the seal member 16e may be disposed as shown in FIG. 7. In FIG. 7, a projection 99 is provided along the refrigerant flow channel groove 32 on the top surface of the mounting plate 96. The width of the projection 99 is narrower than the width of the refrigerant flow channel groove 32, and the seal member 16e is disposed between the side surface of the projection 99 and the wall surface of the refrigerant flow channel groove 32. The seal member 16e is squished by the side surface of the projection 99 and the wall surface of the refrigerant flow channel groove 32 in a lateral direction to exercise sealing performance. In this case, the reaction force of the seal member 16e is generated in the lateral direction, so the side surface of the projection 99 and the wall surface of the refrigerant flow channel groove 32 receive the reaction force. Therefore, a fixing force with the bolts 72 may be small. In the above-described embodiment as well, a gap between the bottom surface of the cooling base 30 and the top surface of the mounting plate 96 is slight, and flow of refrigerant via the gap is small, so there is almost no influence on soaking performance due to flow of refrigerant via the gap. The seal member 16b is more easily disposed than the seal member 16e.

Figure 8:
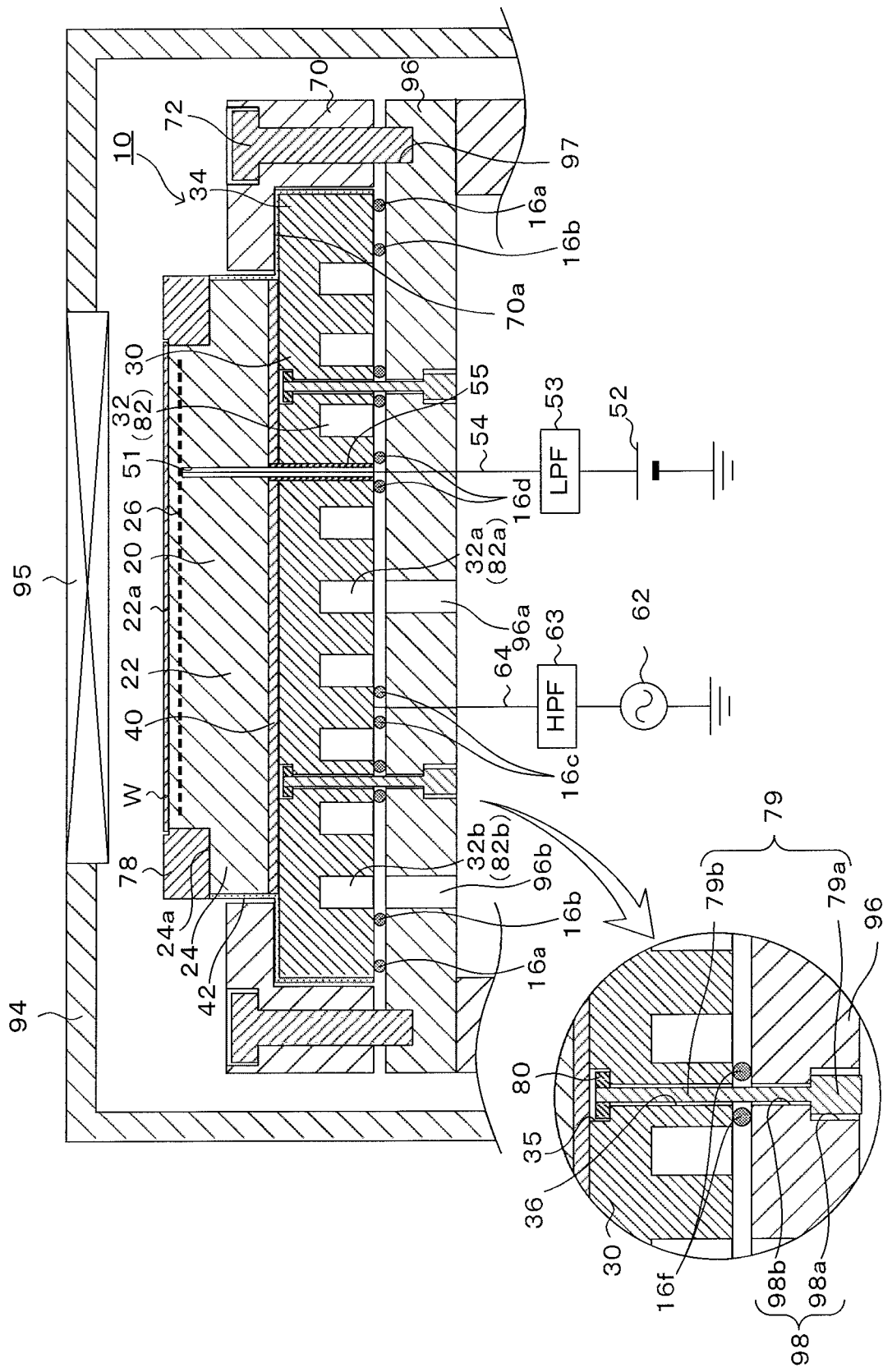
FIG. 8 is a vertical cross-sectional view of the wafer placement table 10 that includes a central part fastening member.
Figure 9:
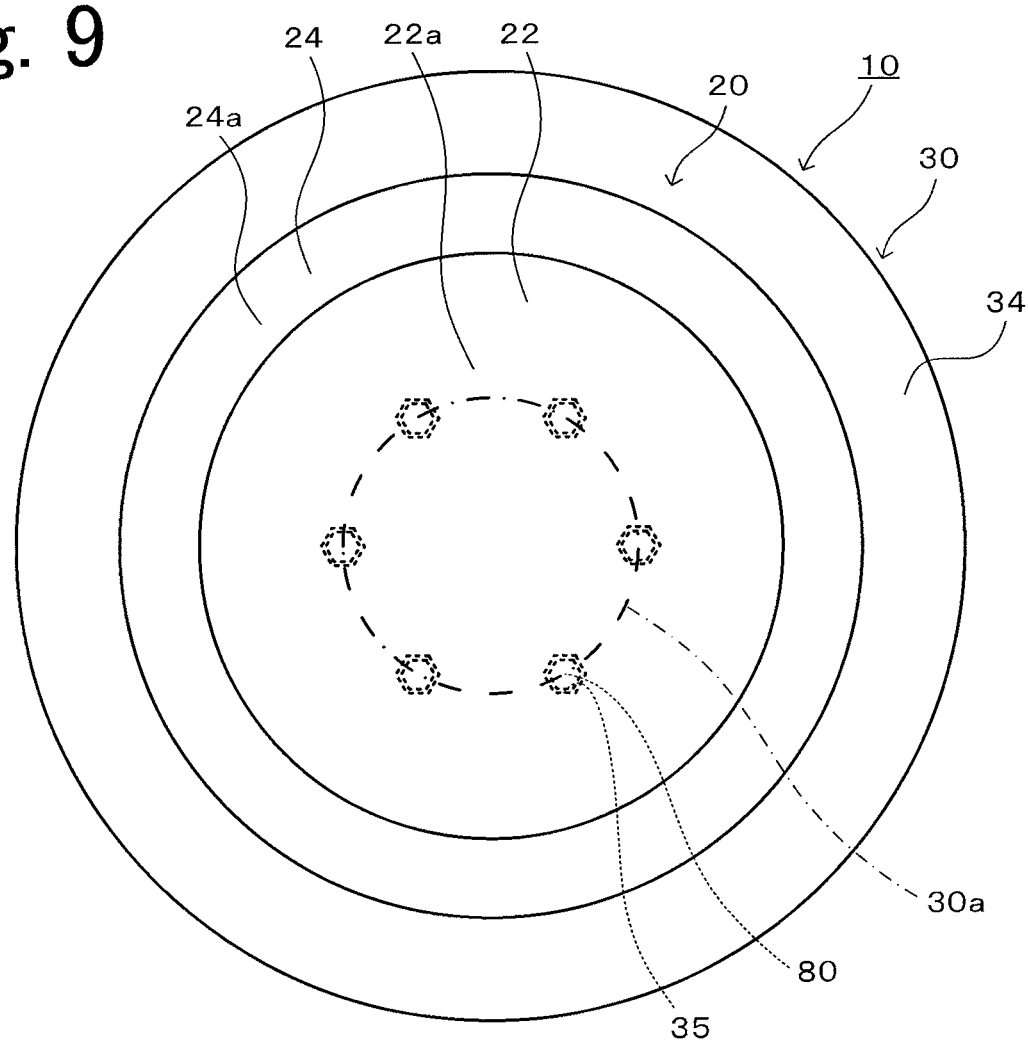
FIG. 9 is a plan view of the wafer placement table 10 of FIG. 8.

In the above-described embodiment, as shown in FIGS. 8 and 9, the cooling base 30 may include a central part fastening member (bolts 79 and nuts 80). In FIGS. 8 and 9, like reference signs are assigned to the same components as those of the above-described embodiment. The plurality of (six in FIG. 9) nuts 80 (for example, hexagon nuts) is disposed in the cooling base 30 at equal intervals along the circumference of a circle 30a less in diameter than the cooling base 30. Each of the nuts 80 is accommodated in a storage hole 35 (for example, hexagon socket) provided on the top surface of the cooling base 30 in a state where rotation is restricted. An insertion hole 36 that extends from each storage hole 35 to the bottom surface of the cooling base 30 is provided in the cooling base 30. Each of the bolts 79 is disposed in a stepped hole 98 extending through the mounting plate 96. The lower part of the stepped hole 98 is a large-diameter part 98a that accommodates a head 79a of the bolt 79, and the upper part of the stepped hole 98 is a small-diameter part 98b that allows insertion of a leg 79b of the bolt 79. The head 79a of the bolt 79 is caught by a step between the large-diameter part 98a and the small-diameter part 98b. The leg 79b of the bolt 79 is inserted through the small-diameter part 98b of the stepped hole 98, further inserted through the insertion hole 36 of the cooling base 30, and screwed to the nut 80. A seal member 16f is disposed around the leg 79b that passes through the gap between the bottom surface of the cooling base 30 and the top surface of the mounting plate 96. By screwing the bolts 79 and the nuts 80 together, the central part (a part where the storage holes 35 are provided) of the cooling base 30 is pressed against the mounting plate 96. The outer peripheral part of the cooling base 30 is pressed against the mounting plate 96 by the clamp member 70 as described above. In other words, with the central part fastening member (the bolts 79 and the nuts 80) and the outer peripheral part fastening member (the clamp member 70, the bolts 72, and the threaded holes 97) of the cooling base 30, the outer peripheral part and the central part of the wafer placement table 10 are fixed to the mounting plate 96 such that the seal members 16a to 16d are pressed from both top and bottom. Therefore, it is possible to prevent a warpage of the wafer placement table 10 resulting from usage of the wafer placement table 10. As a result, it is possible to maintain sealing performance with the seal members 16a to 16d, 16f over a long term.

Figure 10:
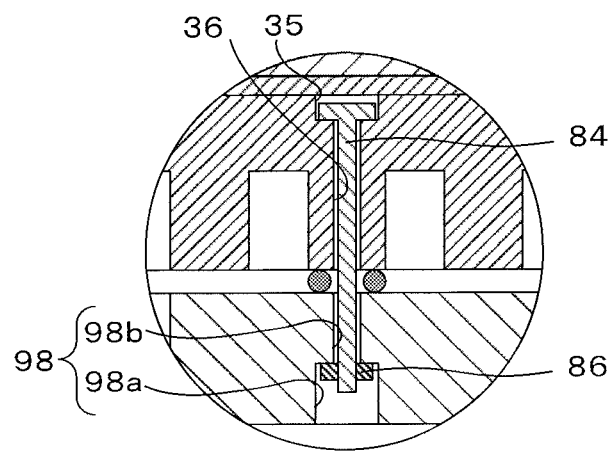
FIG. 10 is a vertical cross-sectional view showing another example of the central part fastening member.

In FIG. 9, the plurality of bolts 79 and the plurality of nuts 80 are provided at equal intervals along the circle 30a. In addition to this, a plurality of the bolts 79 and a plurality of the nuts 80 may be provided at equal intervals along a circle smaller in diameter than the circle 30a. Instead of the central part fastening member (the bolts 79 and the nuts 80) of FIG. 8, a central part fastening member (bolts 84 and nuts 86) shown in FIG. 10 may be adopted. In FIG. 10, the head of each bolt 84 is accommodated in a storage hole 35 in a state where rotation is restricted, the leg of the bolt 84 is inserted through an insertion hole 36 and protruded downward from the bottom surface of the cooling base 30, and further caused to reach the large-diameter part 98a via the small-diameter part 98b. The leg of the bolt 84 is screwed with the nut 86 accommodated in the large-diameter part 98a of the stepped hole 98.

Figure 11:
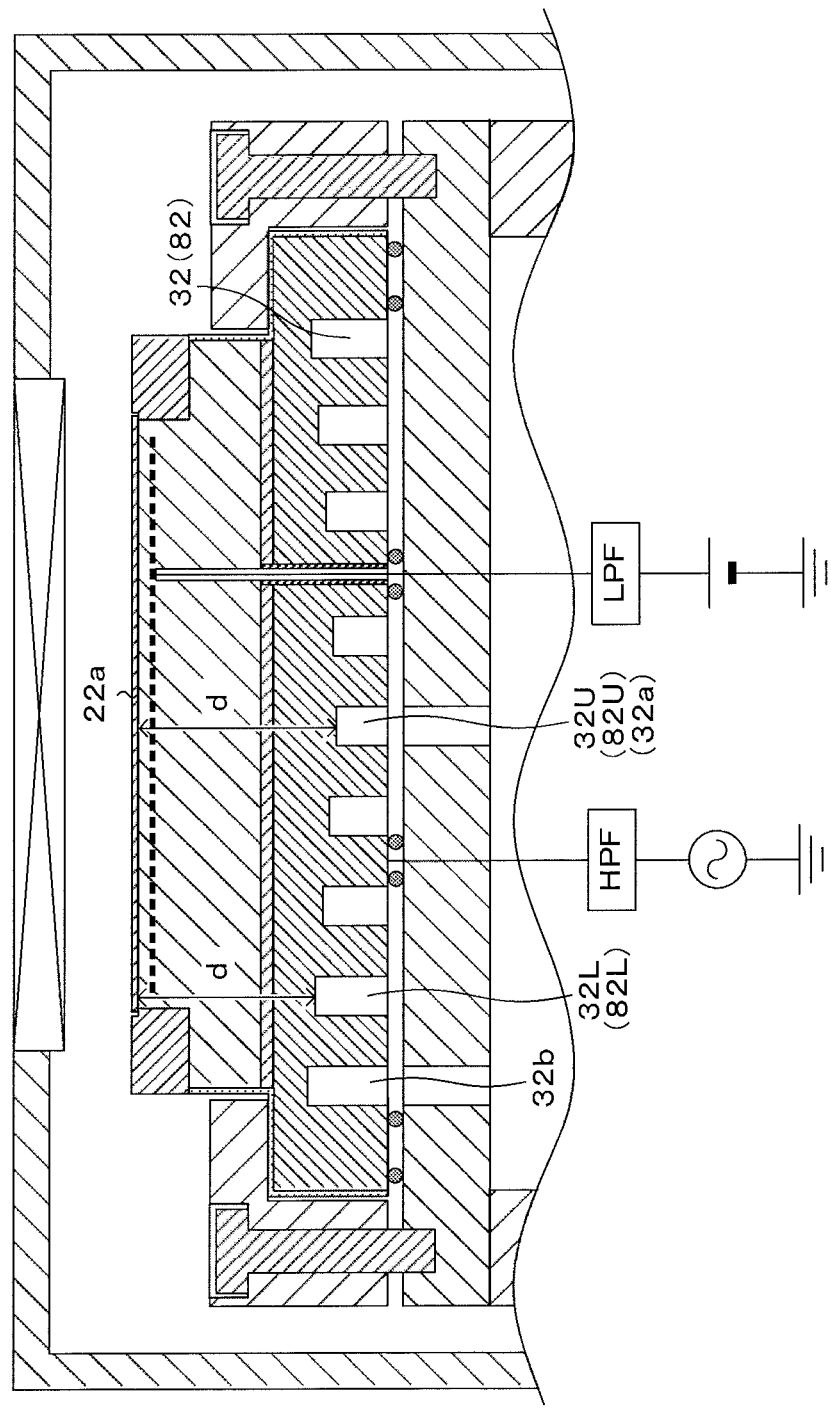
FIG. 11 is a vertical cross-sectional view showing another example of the refrigerant flow channel groove 32.

In the above-described embodiment, as shown in FIG. 11, the refrigerant flow channel groove 32 that has the inlet 32a and the outlet 32b may be configured such that, when a most upstream part 32U and a most downstream part 32L are determined in an area that overlaps the wafer placement surface 22a in plan view, a distance d from the ceiling surface of the refrigerant flow channel groove 32 to the wafer placement surface 22a at the most downstream part 32L may be shorter than the distance d at the most upstream part 32U. The width of the refrigerant flow channel groove 32 may be constant through the entire refrigerant flow channel groove 32. Refrigerant flows from the most upstream part 82U of the refrigerant flow channel 82 toward the most downstream part 82L while dissipating heat from a high-temperature wafer, so the temperature of refrigerant flowing through the refrigerant flow channel 82 at the most downstream part 82L is higher than the temperature of refrigerant flowing through the refrigerant flow channel 82 at the most upstream part 82U. On the other hand, since the distance d from the ceiling surface of the refrigerant flow channel 82 to the wafer placement surface 22a at the most downstream part 82L of the refrigerant flow channel 82 is shorter than the distance d at the most upstream part 82U of the refrigerant flow channel 82, thermal resistance from the ceiling surface of the refrigerant flow channel 82 to the wafer placement surface 22a at the most downstream part 82L is lower than thermal resistance from the ceiling surface of the refrigerant flow channel 82 to the wafer placement surface 22a at the most upstream part 82U. Therefore, generally, it is possible to reduce the temperature difference between a location facing the most upstream part 82U of the refrigerant flow channel 82 and a location facing the most downstream part 82L of the refrigerant flow channel 82 in the wafer placement surface 22*a*. Therefore, the soaking performance of a wafer increases. The distance d preferably gradually reduces from the most upstream part 32U toward the most downstream part 32L. The distance d at the most downstream part 32L is preferably 50% to 90% of the distance d at the most upstream part 32U.

Figure 12:
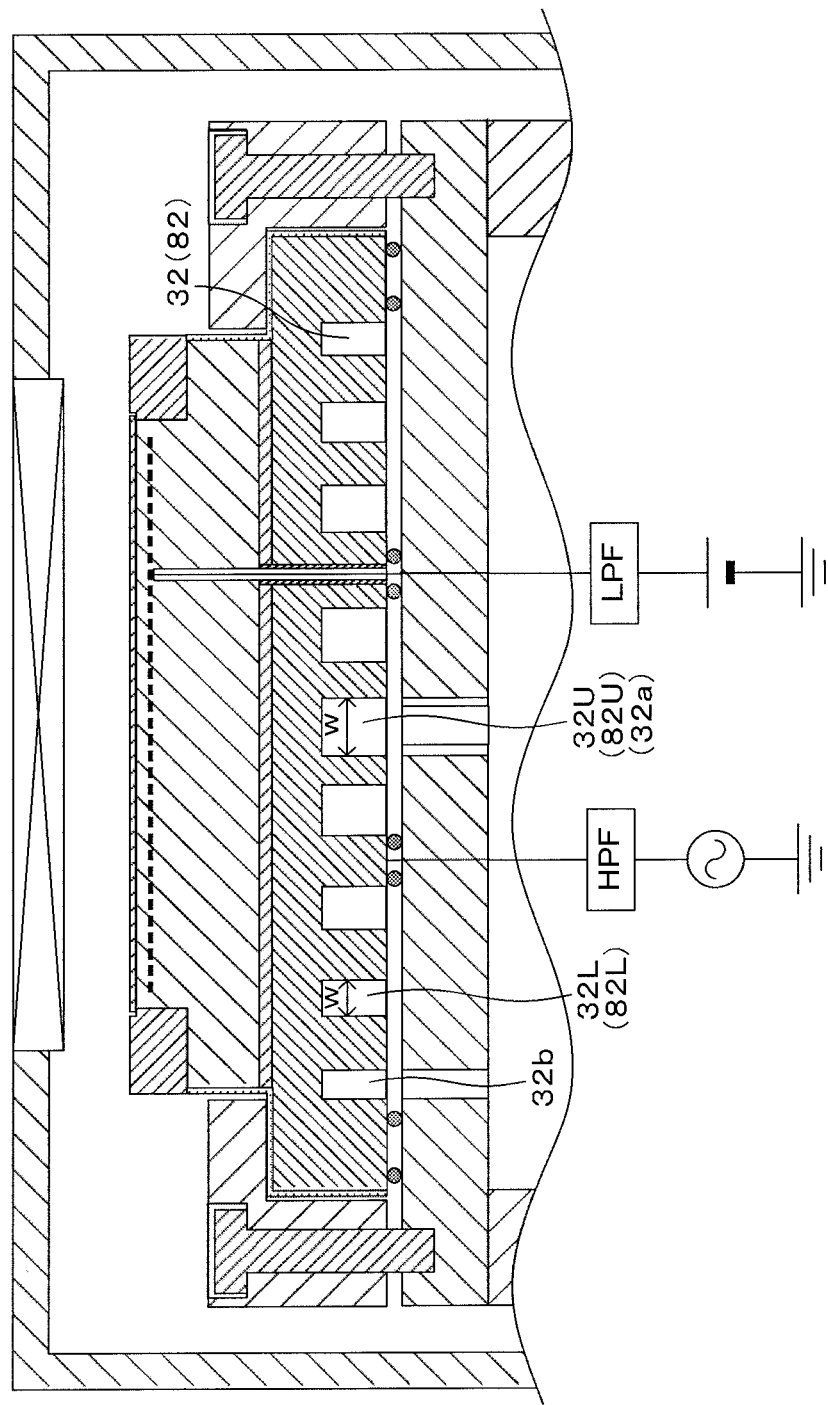
FIG. 12 is a vertical cross-sectional view showing another example of the refrigerant flow channel groove 32.

In the above-described embodiment, as shown in FIG. 12, the refrigerant flow channel groove 32 that has the inlet 32*a* and the outlet 32*b* may be configured such that, when a most upstream part 32U and a most downstream part 32L are determined in an area that overlaps the wafer placement surface 22*a* in plan view, the cross-sectional area of the refrigerant flow channel groove 32 at the most downstream part 32L may be less than the cross-sectional area of the refrigerant flow channel groove 32 at the most upstream part 32U. Here, the height of the refrigerant flow channel groove 32 and the distance from the ceiling surface of the refrigerant flow channel groove 32 to the wafer placement surface 22*a* are constant through the entire refrigerant flow channel groove 32, and the cross-sectional area of the refrigerant flow channel groove 32 is changed by changing the width w of the refrigerant flow channel groove 32. Refrigerant flows from the most upstream part 82U of the refrigerant flow channel 82 toward the most downstream part 82L while dissipating heat from a high-temperature wafer, so the temperature of refrigerant flowing through the refrigerant flow channel 82 at the most downstream part 82L is higher than the temperature of refrigerant flowing through the refrigerant flow channel 82 at the most upstream part 82U. On the other hand, since the cross-sectional area of the refrigerant flow channel 82 at the most downstream part 82L of the refrigerant flow channel 82 is less than the cross-sectional area of the refrigerant flow channel 82 at the most upstream part 82U of the refrigerant flow channel 82, a pressure loss is larger at the most downstream part 82L than at the most upstream part 82U, so heat exchange between refrigerant and the wafer is more promoted at the most downstream part 82L than at the most upstream part 82U. Therefore, generally, it is possible to reduce the temperature difference between a location facing the most upstream part 82U of the refrigerant flow channel 82 and a location facing the most downstream part 82L of the refrigerant flow channel 82 in the wafer placement surface 22*a*. Therefore, the soaking performance of a wafer increases. The cross-sectional area of the refrigerant flow channel groove 32 preferably gradually reduces from the most upstream part 32U of the refrigerant flow channel groove 32 toward the most downstream part 32L. The cross-sectional area at the most downstream part 32L is preferably 60% to 90% of the cross-sectional area at the most upstream part 32U. The cross-sectional area of the refrigerant flow channel groove 32 may be adjusted by at least one of the number of protruded projections (for example, fins) provided on the inner wall of the refrigerant flow channel groove 32, the thickness of each protruded projection, and the length of each protruded projection. The protruded projections may be continuously provided or may be intermittently provided. The protruded projections may be provided at locations facing the refrigerant flow channel groove 32 on the mounting plate 96.

Figure 13:
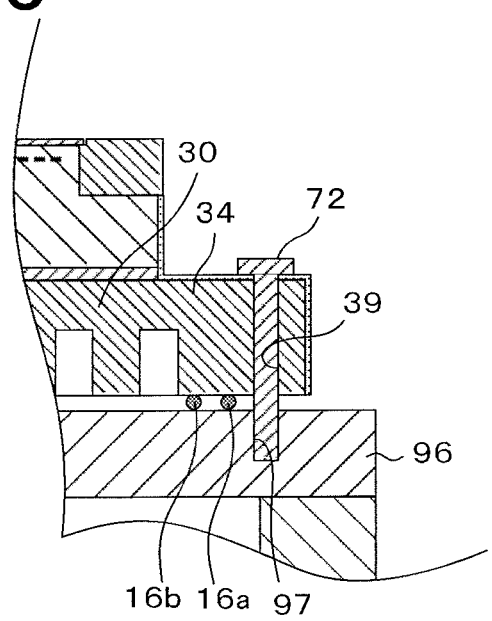
FIG. 13 is a view illustrating another example of an outer peripheral part fastening member.

In the above-described embodiment, the clamp member 70, the bolts 72, and the threaded holes 97 are used as the outer peripheral part fastening member of the wafer placement table 10; however, the configuration is not limited thereto. For example, as shown in FIG. 13, the outer peripheral part of the wafer placement table 10 may be attached to the mounting plate 96 by providing bolt insertion holes 39 in the flange 34 of the cooling base 30 and screwing the bolts 72 to the threaded holes 97 of the mounting plate 96 through the bolt insertion holes 39. Each of the bolts 72 is preferably inserted through the bolt insertion hole 39 with a play. In FIG. 13, instead of bolt fastening from the top, bolt fastening may be performed from the bottom.

In the above-described embodiment, a heat exchange promoting portion that promotes heat exchange between refrigerant flowing through the refrigerant flow channel 82 when the refrigerant flow channel groove 32 is used as the refrigerant flow channel 82 and a wafer W placed on the wafer placement surface 22*a* may be provided in an area around the terminal hole 51 extending through the cooling base 30. Generally, an area around just above such the terminal hole 51 in a wafer W tends to be a hot spot; however, the heat exchange promoting portion is provided in an area around the terminal hole 51 here, so heat dissipation of the area around the terminal hole 51 is promoted. Therefore, it is possible to reduce occurrence of a hot spot in a wafer W. The refrigerant flow channel groove 32 in the heat exchange promoting portion is narrower than the refrigerant flow channel groove 32 in an area outside the area around the terminal hole 51. For example, the width of the refrigerant flow channel groove 32 in the alternate long and short dashes box shown in FIG. 3 may be narrowed. Refrigerant flowing through a part where the refrigerant flow channel 82 is narrow flows at a higher flow rate than refrigerant flowing through a part where the refrigerant flow channel 82 is not narrow. Therefore, heat dissipation of the area around the terminal hole 51 is promoted. The flow channel cross-sectional area of the part where the refrigerant flow channel groove 32 is narrow is preferably 60% to 90% of the flow channel cross-sectional area of the part where the refrigerant flow channel groove 32 is not narrow. Alternatively, in the heat exchange promoting portion, a protruded projection (for example, a fin) may be provided on the inner surface of the refrigerant flow channel groove 32. For example, a fin may be provided in the refrigerant flow channel groove 32 in the alternate long and short dashes box shown in FIG. 3. Refrigerant flowing through the part of the refrigerant flow channel 82 where the fin is provided is more likely to be turbulent flow than refrigerant flowing through the part of the refrigerant flow channel 82 where no fin is provided. Therefore, heat dissipation of the area around the terminal hole 51 is promoted. The flow channel cross-sectional area of the part of the refrigerant flow channel groove 32 where the fin is provided is preferably 60% to 90% of the flow channel cross-sectional area of the part of the refrigerant flow channel groove 32 where no fin is provided. Alternatively, a distance from wafer placement surface 22*a* to the ceiling surface of the refrigerant flow channel groove 32 in the heat exchange promoting portion may be shorter than the distance in an area outside the area around the terminal hole 51. For example, a distance between the wafer placement surface 22*a* and the ceiling surface of the refrigerant flow channel groove 32 in the alternate long and short dashes box shown in FIG. 3 may be shorter than the distance in the other area. The thermal resistance between a wafer W and refrigerant flowing through the part where the distance from the wafer placement surface 22*a* to the ceiling surface of the refrigerant flow channel groove 32 is short is smaller than the thermal resistance between a wafer W and refrigerant flowing through the part where the distance from the wafer placement surface 22a to the ceiling surface of the refrigerant flow channel groove 32 is not short. Therefore, heat dissipation of the area around the terminal hole 51 is promoted. The distance from the wafer placement surface 22a to the ceiling surface of the refrigerant flow channel groove 32 in the heat exchange promoting portion is preferably 50% to 90% of the distance from the wafer placement surface 22a to the ceiling surface of the refrigerant flow channel groove 32, other than the heat exchange promoting portion. A heat exchange promoting portion may be provided in an area around each of gas supply holes and lift pin holes (described later) in the cooling base 30.

In the above-described embodiment, the mounting plate 96 in the chamber 94 is made up of a single layer. Alternatively, the mounting plate 96 may be made up of a plurality of layers. In this case, at least one of the plurality of layers just needs to be made of an electrically insulating material. For example, all the plurality of layers may be made of an electrically insulating material or one or some of the plurality of layers (for example, a topmost layer) may be made of an electrically insulating material and the remaining layers may be made of an electrically conductive material.

In the above-described embodiment, a composite material of metal and ceramics has been illustrated as the material that is a component of the cooling base 30; however, the configuration is not limited thereto. For example, the cooling base 30 may be made of a metal material, such as aluminum and an aluminum alloy. However, when a reduction in difference in CTE from the ceramic base 20 is taken into consideration, a composite material of metal and ceramics is preferable.

In the above-described embodiment, the wafer attraction electrode 26 is incorporated in the central part 22 of the ceramic base 20. Instead of or in addition to this, an RF electrode for generating plasma may be incorporated. In this case, a radio-frequency power supply is connected to not the cooling base 30 but the RF electrode. A focus ring (FR) attraction electrode may be incorporated in the outer peripheral part 24 of the ceramic base 20. In this case, a direct current power supply is connected to the FR attraction electrode. The ceramic base 20 may incorporate a heater electrode (resistance heating element). In this case, a heater power supply is connected to the heater electrode. The ceramic base 20 may incorporate one layer of electrode or may incorporate two or more layers of electrode.

In the wafer placement table 10 of the above-described embodiment, a hole may be provided so as to extend through the wafer placement table 10 from the bottom surface of the cooling base 30 to the wafer placement surface 22a. Examples of such a hole include a gas supply hole for supplying heat transfer gas (for example, He gas) to the back surface of a wafer W and a lift pin hole for allowing insertion of a lift pin for lifting or lowering a wafer W with respect to the wafer placement surface 22a. Heat transfer gas is supplied to a space formed by the wafer W and a large number of small projections (which support a wafer W) (not shown) provided on the wafer placement surface 22a. The lift pin holes are provided at three locations when a wafer W is supported by, for example, three lift pins. When such through-holes are provided, a seal member is also disposed around each of such through-holes as in the case around each of the electrically insulating tubes 55 in the space between the bottom surface of the ceramic base 20 and the top surface of the cooling base 30.

In the above-described embodiment, the seal member 16a is provided at the outermost periphery. Alternatively, the seal member 16a may be omitted.

In the above-described embodiment, the refrigerant flow channel groove 32 is spirally provided from the inlet 32a to the outlet 32b; however, the shape of the refrigerant flow channel groove 32 is not limited. For example, the refrigerant flow channel groove 32 may be provided in a zigzag shape in plan view.

In the above-described embodiment, the ceramic sintered body 120 of FIG. 4A is made by firing a ceramic powder mold by hot pressing. The mold at that time may be made by laminating a plurality of tape molds, or may be made by mold casting, or may be made by compacting ceramic powder.

In the above-described embodiment, grooves for fitting the seal members 16a to 16d may be respectively provided at locations at which the seal members 16a to 16d are disposed on the top surface of the mounting plate 96. Instead of or in addition to this, grooves for fitting the seal members 16a to 16d may be provided at locations where the seal members 16a to 16d are disposed on the bottom surface of the cooling base 30.

Figure 14:
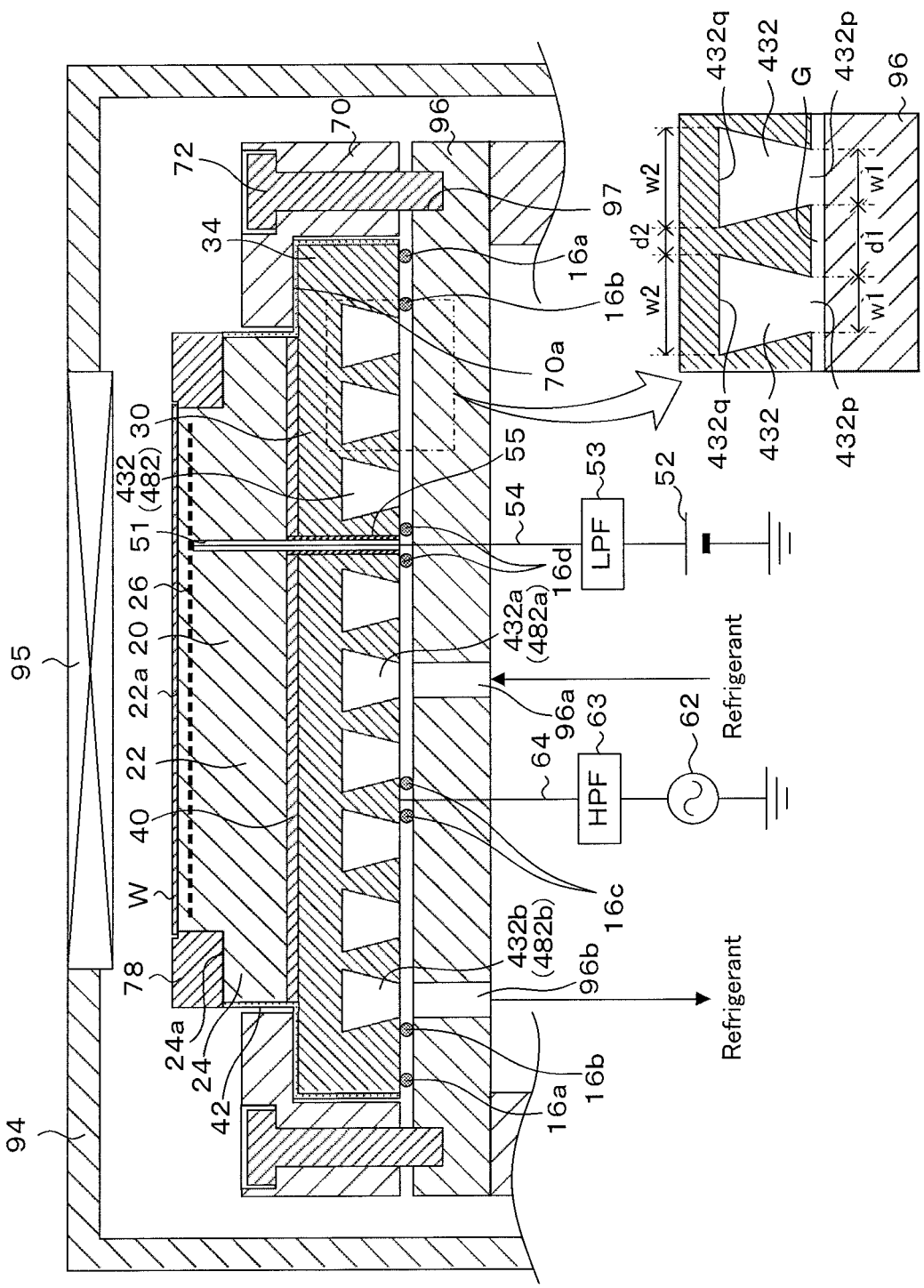
FIG. 14 is a vertical cross-sectional view of a wafer placement table that includes a refrigerant flow channel groove 432.

In the above-described embodiment, the shape of the vertical cross-section of the refrigerant flow channel groove 32 (a shape that appears on the cross section of the wafer placement table 10, taken along a plane perpendicular to the wafer placement surface 22a) is set to a rectangular shape; however, the configuration is not limited thereto. For example, as shown in FIG. 14, the shape of the vertical cross-section of a refrigerant flow channel groove 432 may be configured such that the width w2 of a ceiling part 432q of the refrigerant flow channel groove 432 is wider than the width w1 of an opening part 432p of the refrigerant flow channel groove 432 (w2>w1). In FIG. 14, like reference signs are assigned to the same components as those of the above-described embodiment. The opening part 432p of the refrigerant flow channel groove 432 is closed by the top surface of the mounting plate 96 in the chamber 94 to form a refrigerant flow channel 482. An inlet 432a and an outlet 432b of the refrigerant flow channel groove 432 (an inlet 482a and an outlet 482b of the refrigerant flow channel 482) are respectively connected to the refrigerant supply port 96a and the refrigerant discharge port 96b provided in the mounting plate 96. Here, the space d1 between any adjacent opening parts 432p of the refrigerant flow channel groove 432 is wider than the space d2 between any adjacent ceiling parts 432q of the refrigerant flow channel groove 432 (d1>d2). In FIG. 14, since the distance d1 between any adjacent opening parts 432p of the refrigerant flow channel groove 432 is wide, it is possible to reduce mixing of refrigerant through a gap G between the opening parts 432p. In addition, since the space d2 between any adjacent ceiling parts 432q of the refrigerant flow channel groove 432 is narrow, an area of a wafer W that is cooled by refrigerant widens, so cooling efficiency increases. Furthermore, since the total area of the opening part 432p of the refrigerant flow channel groove 432 is narrower than the total area of the ceiling part 432q, a force due to the pressure of refrigerant applied between the cooling base 30 and the chamber 94-side mounting plate 96 is reduced. As a result, it is possible to suppress a warpage of the wafer placement table itself. Furthermore, since the space d1 between the opening parts 432p of the refrigerant flow channel groove 432 is relatively wide, it is possible to reduce mixing of refrigerant through the gap G between the opening parts 432p even when the opening part 432p is not hermetically sealed by a seal ring or the like. The refrigerant flow channel groove 432 is able to be formed by using a grind stone having the same shape in the shape of the vertical cross-section as the refrigerant flow channel groove 432. In this case, the inlet 432a and the outlet 432b of the refrigerant flow channel groove 432 are circular holes (holes having a cylindrical shape).

Figure 15:
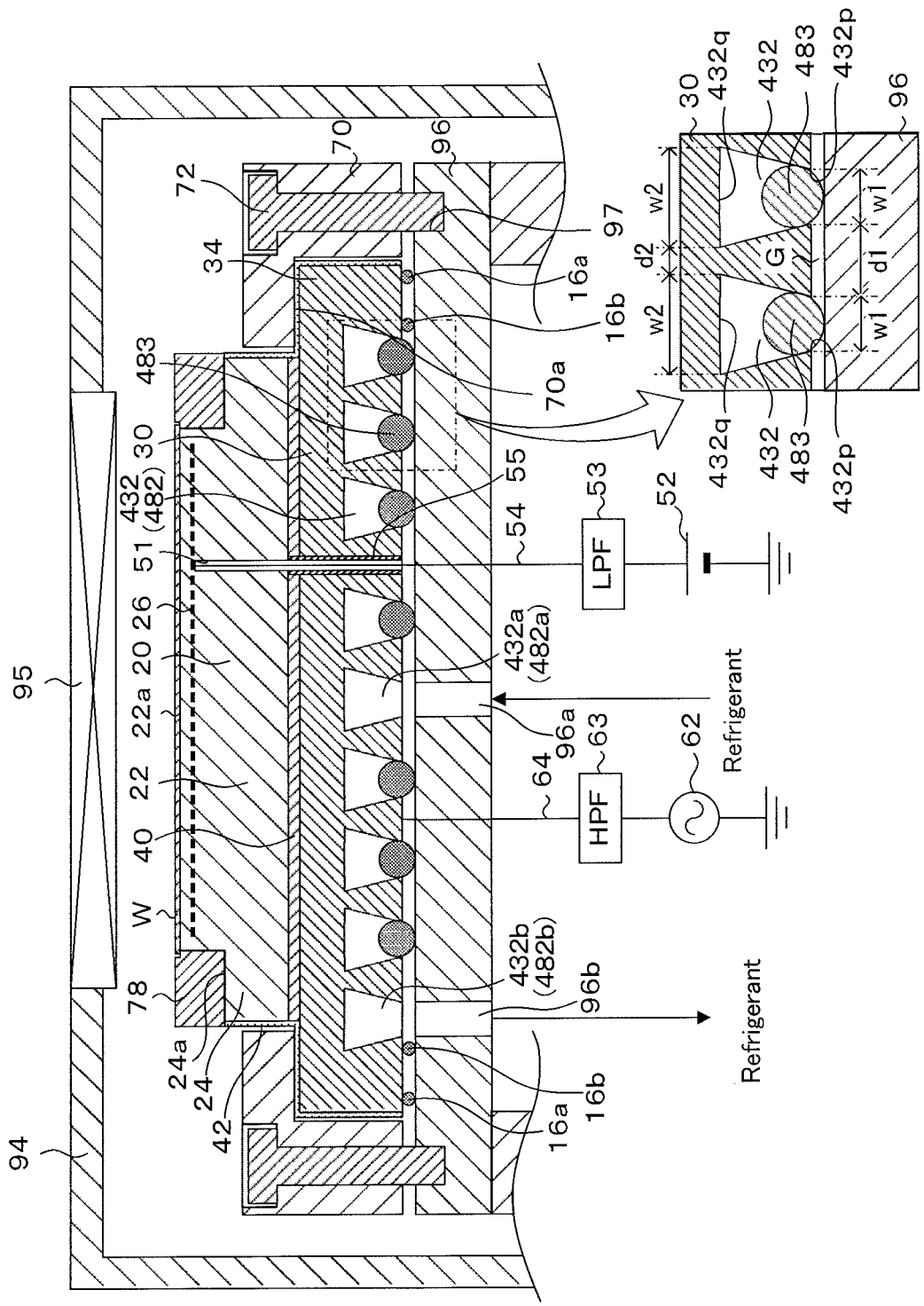
FIG. 15 is a vertical cross-sectional view, of a wafer placement table in which an opening part 432p of the refrigerant flow channel groove 432 is closed by a seal ring 483.

The opening part 432p of the refrigerant flow channel groove 432 may be hermetically closed by a seal ring 483 as shown in FIG. 15. In FIG. 15, like reference signs are assigned to the same components as those shown in FIG. 14. The seal ring 483 appears in the same shape as the refrigerant flow channel groove 432 in plan view. With this configuration, the seal ring 483 reduces mixing of refrigerant through the gap G between any adjacent opening parts 432p of the refrigerant flow channel groove 432, so it is possible to relatively narrow the space d1 between any adjacent opening parts 432p of the refrigerant flow channel groove 432 compared with FIG. 14, and, as a result, it is possible to densely provide the refrigerant flow channel groove 432. Accordingly, since the space d2 between any adjacent ceiling parts 432q of the refrigerant flow channel groove 432 is narrower, an area of a wafer W that is cooled by refrigerant further widens, so cooling efficiency further increases.

Figure 16:
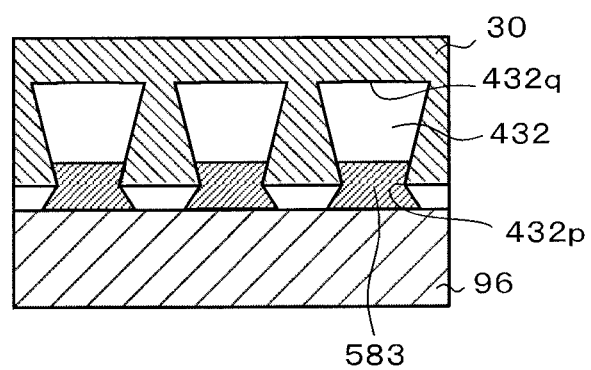
FIG. 16 is a vertical cross-sectional view (partially enlarged view) of a wafer placement table in which an opening part 432p of the refrigerant flow channel groove 432 is closed by a seal ring 583.

In FIG. 15, the shape of the vertical cross-section of the seal ring 483 is a circular shape; however, the configuration is not limited thereto. For example, as in the case of a seal ring 583 shown in FIG. 16, the shape of the vertical cross-section is set to a shape such that right and left sides of a trapezoid (or rectangle) are recessed inward, an upper part above the recesses of the seal ring 583 may be disposed so as to be in close contact with the wall surfaces in the refrigerant flow channel groove 432, and a lower part below the recesses of the seal ring 583 may be disposed outside the refrigerant flow channel groove 432 (a gap between the cooling base 30 and the mounting plate 96). With this configuration, even when the cooling base 30 is pressed against the mounting plate 96, it is possible to prevent the seal ring 583 from being pushed into the refrigerant flow channel groove 432.

Figure 17:
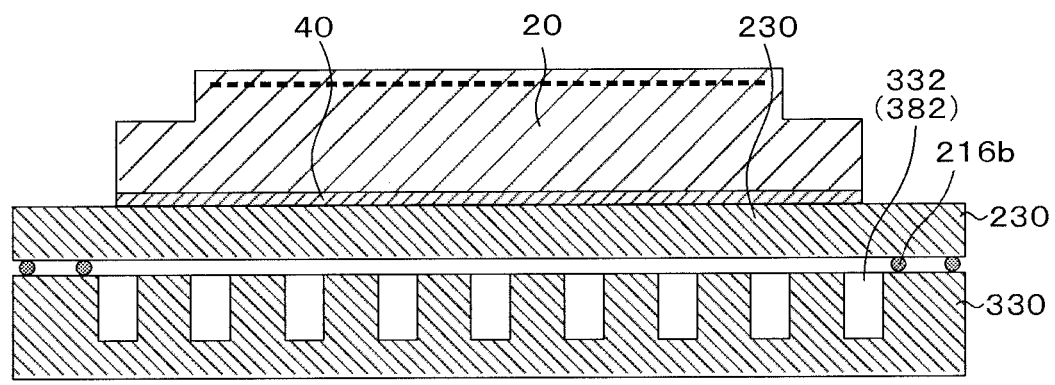
FIG. 17 is a vertical cross-sectional view showing a reference example.

Incidentally, as for a structure for reducing types of materials used for a cooling base, as shown in FIG. 17, a structure in which a sheet-shaped cooling base 230 with no refrigerant flow channel groove is bonded to the bottom surface of the ceramic base 20 via the metal bonding layer 40 and a sheet member 330 having a refrigerant flow channel groove 332 that opens upward is attached to the bottom surface of the cooling base 230 via a seal member 216b is also conceivable. In this case, even when the cooling base 230 is made of an expensive material, but when the sheet member 330 is made of an inexpensive material, it is possible to hold down the cost of a wafer placement table. However, with the structure of FIG. 17, the refrigerant flow channel 382 formed by closing the top opening of the refrigerant flow channel groove 332 with the cooling base 230 undergoes heat exchange with the ceramic base 20 through the ceiling surface; however, sufficient heat exchange with the ceramic base 20 is not performed through the side surface. In contrast to this, in the above-described embodiment, since sufficient heat exchange is performed with the ceramic base 20 through the ceiling surface and the side surface of the refrigerant flow channel 82, it is possible to efficiently dissipate heat from a wafer W.

The present application claims priority from Japanese Patent Application No. 2022-011102, filed on Jan. 27, 2022 and Japanese Patent Application No. 2022-108450 Jul. 5, 2022 the entire contents of which are incorporated herein by reference.

What is claimed is:

1. A wafer placement table comprising:
   a ceramic base having a wafer placement surface on its top surface and incorporating an electrode;
   a cooling base provided on a bottom surface side of the ceramic base; and
   a refrigerant flow channel groove provided in the cooling base so as to open at a bottom surface of the cooling base;
   wherein in an area that overlaps the wafer placement surface in plan view of the refrigerant flow channel groove, a distance from a ceiling surface of the refrigerant flow channel groove to the wafer placement surface at a most downstream part of the refrigerant flow channel groove is shorter than the distance at a most upstream part of the refrigerant flow channel groove; and
   the distance gradually reduces from the upstream part toward the most downstream part.

2. The wafer placement table according to claim 1, wherein
   the cooling base is made of a composite material comprising metal and ceramics.

3. The wafer placement table according to claim 1, wherein
   the cooling base is bonded to a bottom surface of the ceramic base via a metal bonding layer.

4. The wafer placement table according to claim 1, wherein
   in an area that overlaps the wafer placement surface in plan view of the refrigerant flow channel groove, a cross-sectional area of the refrigerant flow channel groove at a most downstream part of the refrigerant flow channel groove is less than the cross-sectional area at a most upstream part of the refrigerant flow channel groove.

5. The wafer placement table according to claim 1, wherein
   the cooling base has a hole extending through the cooling base in an up and down direction, the cooling base includes a heat exchange promoting portion in an area around the hole, and, when the refrigerant flow channel groove is used as a refrigerant flow channel, the heat exchange promoting portion promotes heat exchange between refrigerant flowing through the refrigerant flow channel and a wafer placed on the wafer placement surface.

6. The wafer placement table according to claim 1, wherein
   the bottom surface of the cooling base is attached to a mounting plate that is different from the wafer placement table via a seal member surrounding the refrigerant flow channel groove when the wafer placement table is used.

7. The wafer placement table according to claim 6, wherein
   the cooling base has a central part fastening member that fastens a central part of the cooling base to the mounting plate.

8. The wafer placement table according to claim 1, wherein
   in a shape of a vertical cross-section of the refrigerant flow channel groove, the width of a ceiling part of the refrigerant flow channel groove is wider than the width of an opening part of the refrigerant flow channel groove, and a space between any adjacent opening parts of the refrigerant flow channel groove is wider than a space between any adjacent ceiling parts of the refrigerant flow channel groove.

9. The wafer placement table according to claim 8, wherein the opening parts of the refrigerant flow channel groove are not hermetically sealed by a seal ring.

10. The wafer placement table according to claim 8, wherein the opening parts of the refrigerant flow channel groove are hermetically sealed by a seal ring.

11. A member for semiconductor manufacturing apparatus, comprising:

the wafer placement table according to claim 1;

a mounting plate on which the bottom surface of the cooling base is mounted via a seal member surrounding the refrigerant flow channel groove; and an outer peripheral part fastening member that fastens an outer peripheral part of the wafer placement table to the mounting plate.

12. The member for semiconductor manufacturing apparatus according to claim 11, wherein the absolute value of a difference in coefficient of linear thermal expansion from 40° C. to 400° C. between the cooling base and the mounting plate is greater than or equal to $1.5 \times 10^{-6}$/K.

13. The wafer placement table according to claim 1, wherein the seal member is an electrically insulating material.

14. The wafer placement table according to claim 1, wherein the seal member is an electrically conductive material.

* * * * *